US012453198B2

(12) United States Patent
Yamada et al.

(10) Patent No.: US 12,453,198 B2
(45) Date of Patent: Oct. 21, 2025

(54) IMAGING APPARATUS

(71) Applicant: Panasonic Intellectual Property Management Co., Ltd., Osaka (JP)

(72) Inventors: Takayoshi Yamada, Hyogo (JP); Yoshihiro Sato, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 398 days.

(21) Appl. No.: 18/174,601

(22) Filed: Feb. 24, 2023

(65) Prior Publication Data

US 2023/0223411 A1 Jul. 13, 2023

Related U.S. Application Data

(63) Continuation of application No. PCT/JP2021/033481, filed on Sep. 13, 2021.

(30) Foreign Application Priority Data

Sep. 17, 2020 (JP) ................................ 2020-156104

(51) Int. Cl.
*H10F 39/00* (2025.01)
*H10F 39/18* (2025.01)

(52) U.S. Cl.
CPC .......... *H10F 39/802* (2025.01); *H10F 39/18* (2025.01); *H10F 39/807* (2025.01); *H10F 39/811* (2025.01)

(58) Field of Classification Search
None
See application file for complete search history.

(56) References Cited

U.S. PATENT DOCUMENTS

2015/0002719 A1* 1/2015 Isono ................... H10F 39/011
348/311
2016/0204156 A1 7/2016 Togashi
(Continued)

FOREIGN PATENT DOCUMENTS

| WO | 2015/025723 | 2/2015 |
| WO | 2020/022462 | 1/2020 |
| WO | 2020/026851 A1 | 2/2020 |

OTHER PUBLICATIONS

International Search Report of PCT application No. PCT/JP2021/033481 dated Dec. 7, 2021.

*Primary Examiner* — Nilufa Rahim
(74) *Attorney, Agent, or Firm* — Rimon P.C.

(57) ABSTRACT

An imaging apparatus includes a pixel region including a first substrate section and pixels, and a peripheral region including a second substrate section and no pixels. Each of the pixels includes a first electrode; a second electrode; a photoelectric conversion layer that is disposed between the first electrode and the second electrode; and a charge accumulation region disposed in the first substrate section. The pixel region includes first penetrating electrodes that electrically connect the first electrode to the charge accumulation region. The peripheral region includes second penetrating electrodes. An areal density of the first penetrating electrodes that is a ratio of an area of the first penetrating electrodes to an area of the pixel region is different from an areal density of the second penetrating electrodes that is a ratio of an area of the second penetrating electrodes to an area of the peripheral region.

20 Claims, 22 Drawing Sheets

(56) References Cited

U.S. PATENT DOCUMENTS

2018/0286910 A1* 10/2018 Kobayashi ............ H10F 39/802
2020/0035739 A1* 1/2020 Saito .................... H10F 39/021
2021/0273017 A1 9/2021 Murata et al.
2021/0313381 A1 10/2021 Murata et al.
2022/0139978 A1* 5/2022 Kamei .................. H10F 39/182
257/432

* cited by examiner

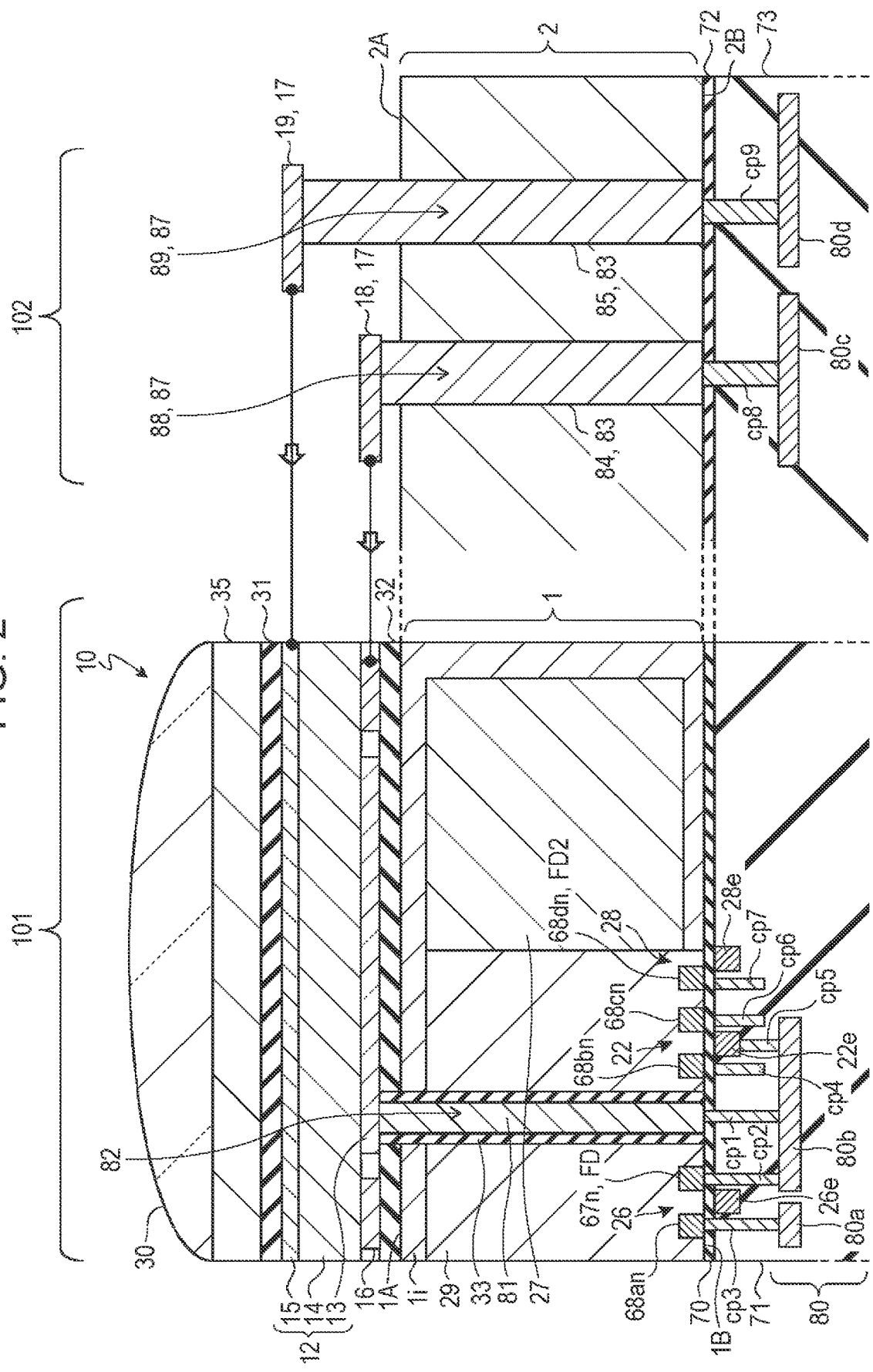

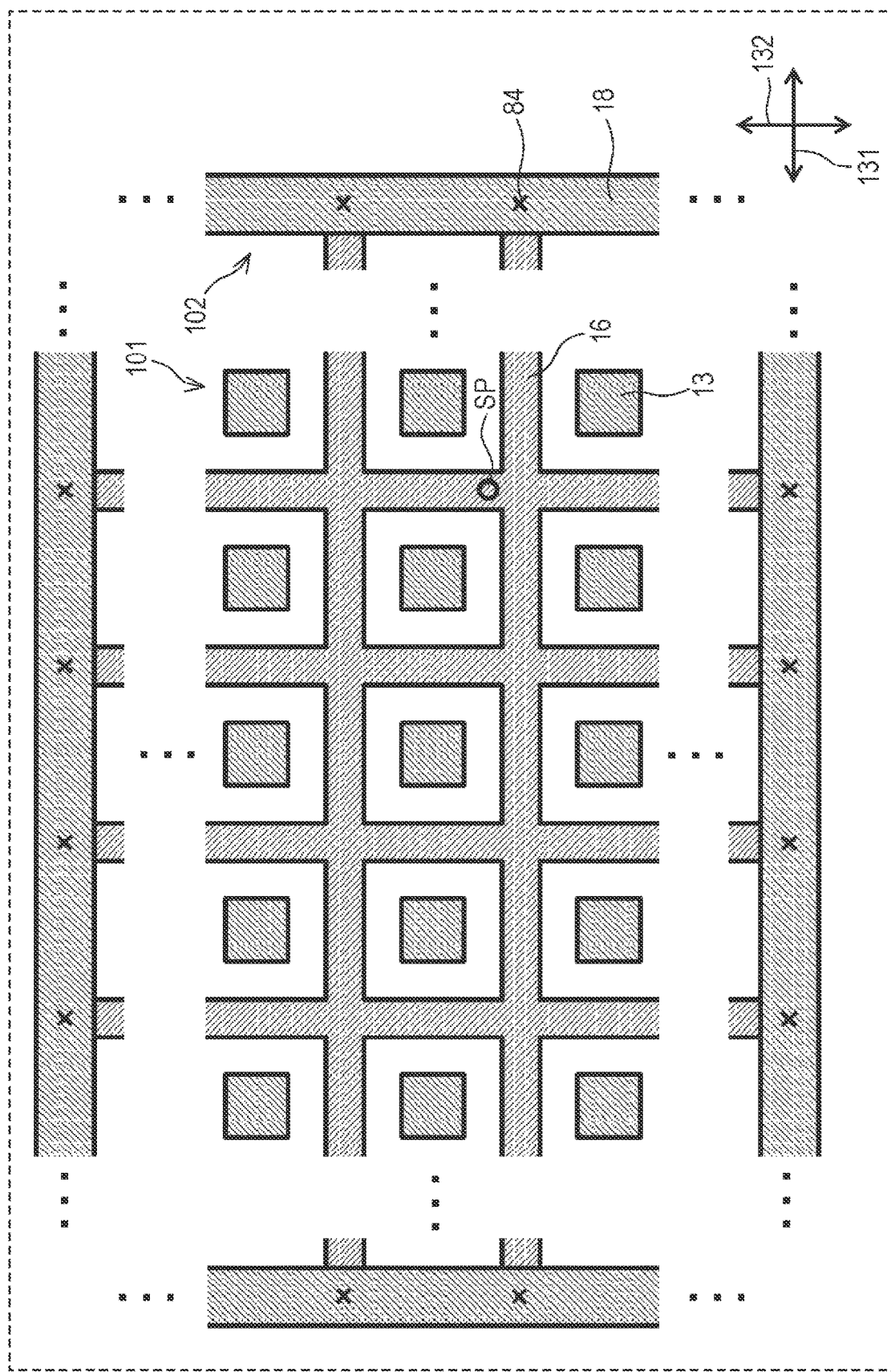

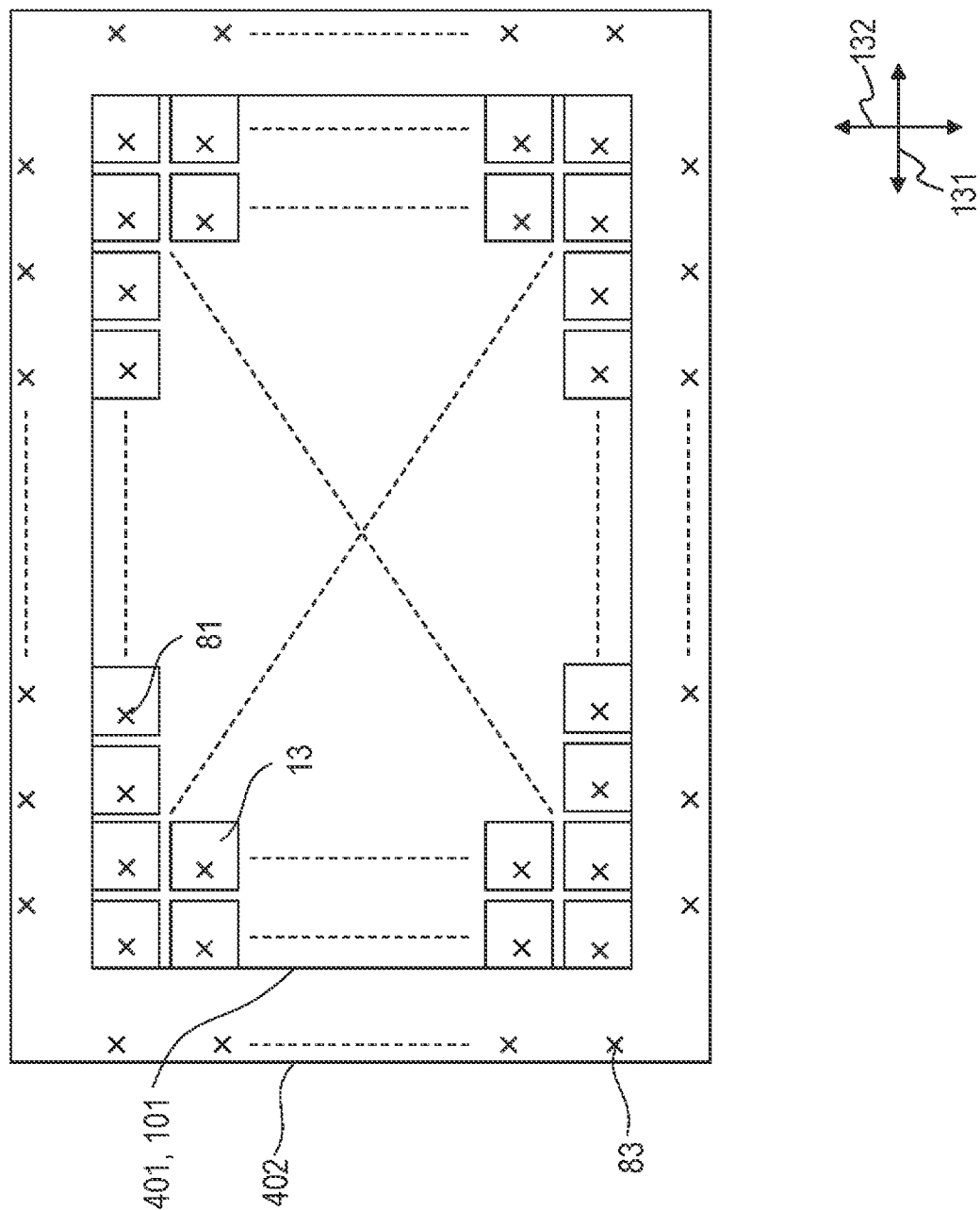

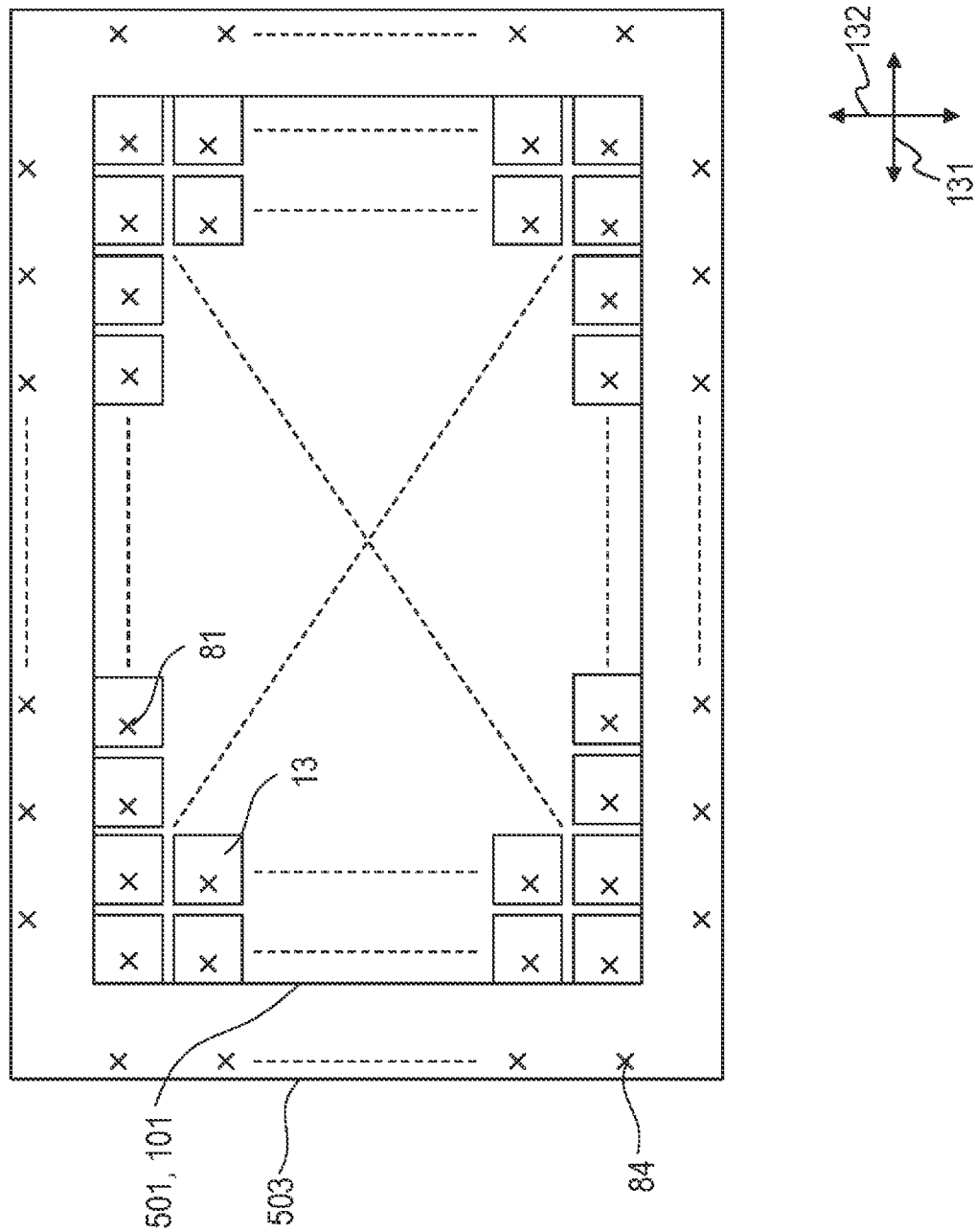

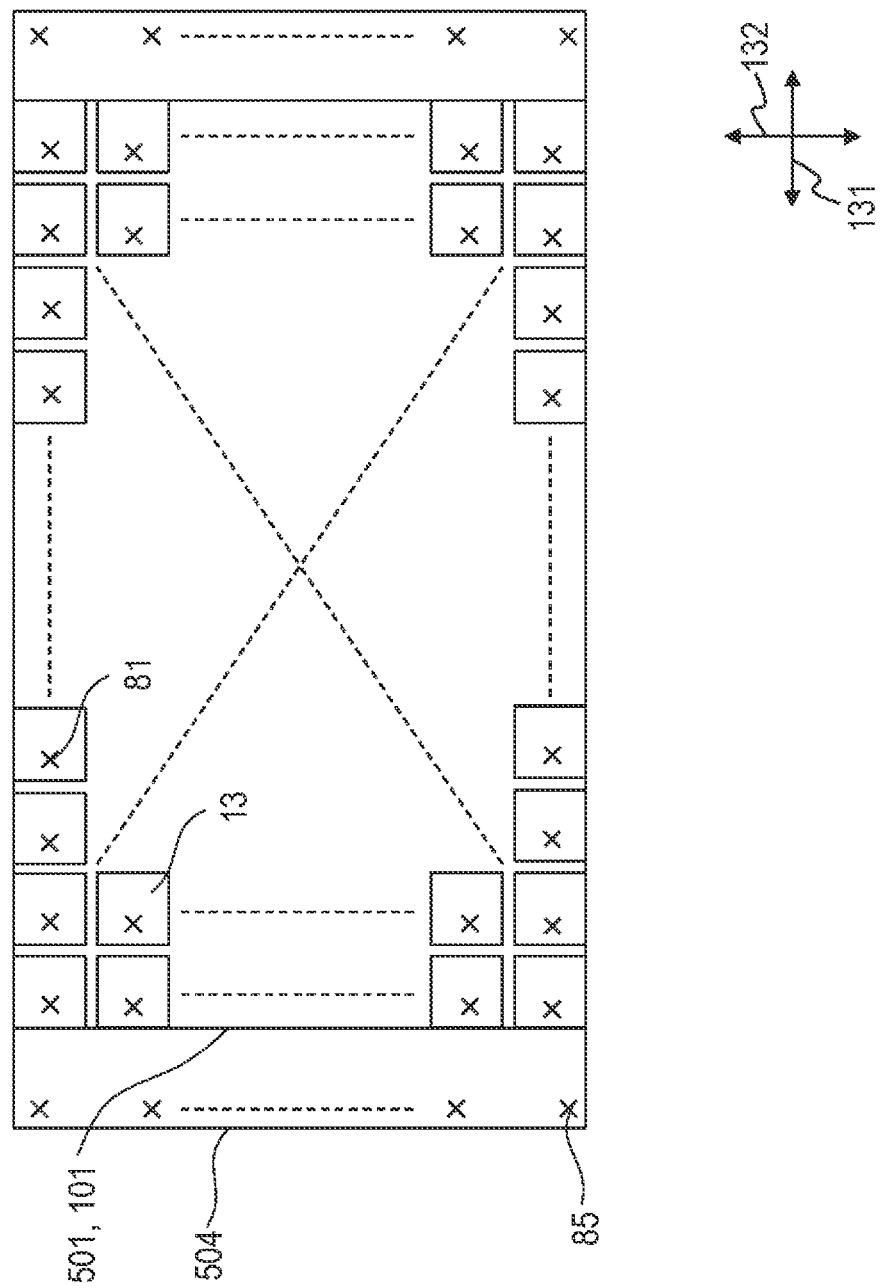

IMAGING APPARATUS

BACKGROUND

1. Technical Field

The present disclosure relates to an imaging apparatus.

2. Description of the Related Art

Digital cameras, in particular, charge-coupled device (CCD) image sensors and complementary metal oxide semiconductor (CMOS) image sensors, are in widespread use. These image sensors include photodiodes formed on a semiconductor substrate.

Structures in which a photoelectric converter having a photoelectric conversion layer is disposed above a semiconductor substrate are disclosed. An imaging apparatus having such a structure may be referred to as a stacked-type imaging apparatus. In the stacked-type imaging apparatus, charges generated through photoelectric conversion are accumulated in a charge accumulation region. A signal responsive to an amount of charges accumulated in the charge accumulation region is read by a CCD circuit or CMOS circuit disposed on the semiconductor substrate.

International Publication No. 2015/025723 discloses a backside-illumination type imaging apparatus. The imaging apparatus includes a photoelectric converter having a photoelectric conversion layer on a backside of a semiconductor substrate. A wiring layer is disposed on a front side of the semiconductor substrate.

The imaging apparatus disclosed in International Publication No. 2015/025723 includes through-holes in a pixel region of the semiconductor substrate. Penetrating electrodes are disposed in the through-holes. Each penetrating electrode electrically connects an element on a first surface of the semiconductor substrate to an element on a second surface of the semiconductor substrate. Specifically, each penetrating electrode electrically connects a photoelectric converter located on the backside of the semiconductor layer to a wiring layer located on the front surface of the semiconductor substrate.

SUMMARY

In one general aspect, the techniques disclosed here feature an imaging apparatus including: a pixel region including a first substrate section and pixels; and a peripheral region including a second substrate section and no pixels. The first substrate section and the second substrate section are included in a single semiconductor substrate. Each of the pixels includes: a first electrode; a second electrode; a photoelectric conversion layer that is disposed between the first electrode and the second electrode; and a charge accumulation region disposed in the first substrate section. The pixel region includes: first through-holes that penetrate the first substrate section; and first penetrating electrodes, each of the first penetrating electrodes being disposed in a corresponding first through-hole of the first through-holes and electrically connecting the first electrode to the charge accumulation region. The peripheral region includes: second through-holes that penetrate the second substrate section; and second penetrating electrodes, each of the second penetrating electrodes being disposed in a corresponding second through-hole of the second through-holes. An areal density of the first penetrating electrodes that is a ratio of an area of the first penetrating electrodes to an area of the pixel region is different from an areal density of the second penetrating electrodes that is a ratio of an area of the second penetrating electrodes to an area of the peripheral region.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 2 is a cross-sectional view schematically illustrating a device structure;

FIG. 3 is a plan view illustrating a shield electrode;

FIG. 9 illustrates a number density of the first penetrating electrodes and a number density of the second penetrating electrodes;

FIG. 11A illustrates a number density of third penetrating electrodes;

FIG. 11B illustrates a number density of fourth penetrating electrodes;

DETAILED DESCRIPTIONS

Outline of Embodiment of the Disclosure

Figure 1:
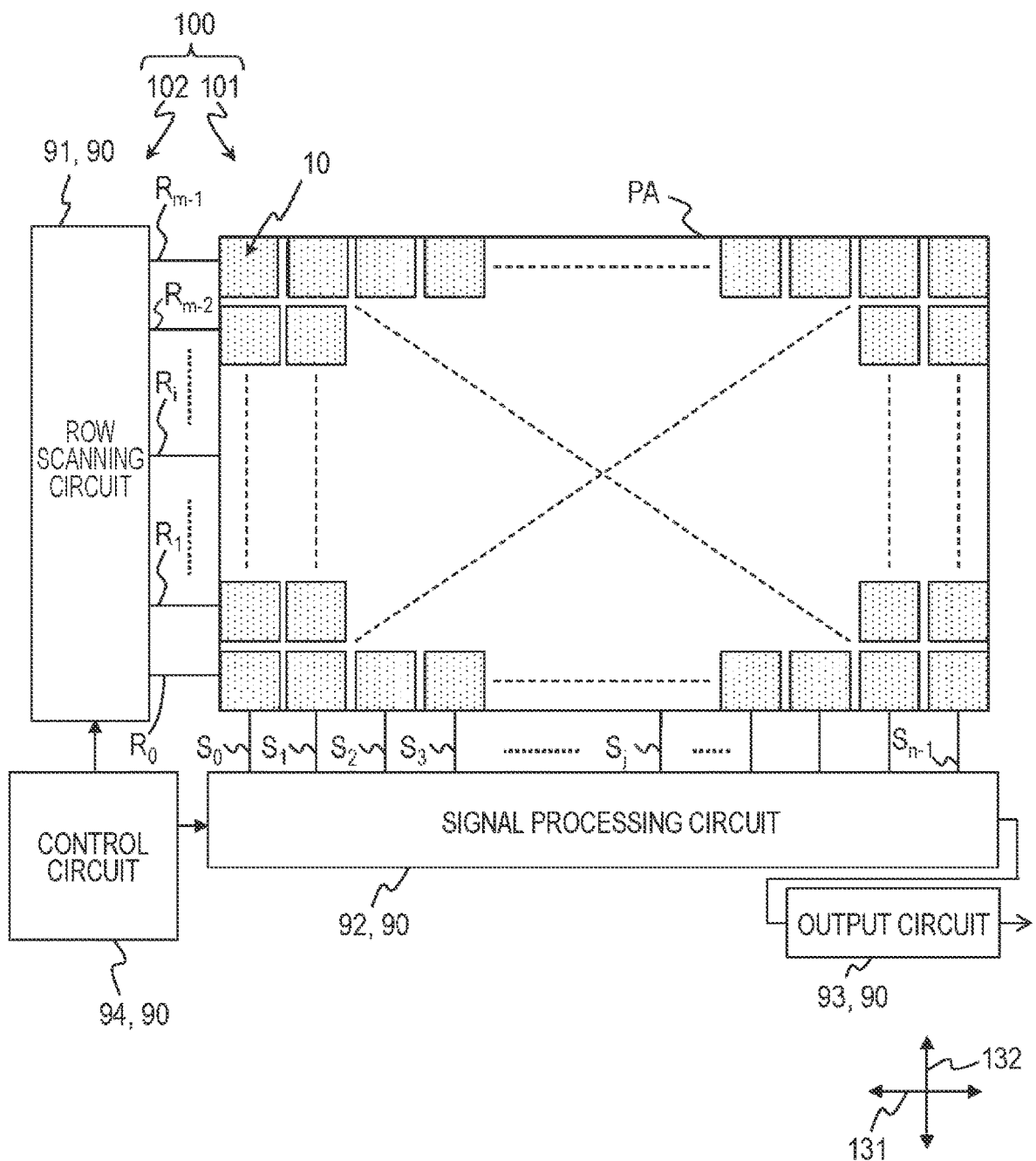
FIG. 1 is a configuration diagram of an imaging apparatus.

An imaging apparatus according to a first aspect of the disclosure includes:
- a pixel region including a first substrate section and pixels;
- a peripheral region including a second substrate section and no pixels. The first substrate section and the second substrate section are included in a single semiconductor substrate. Each of the pixels includes:
- a first electrode;
- a second electrode;
- a photoelectric conversion layer that is disposed between the first electrode and the second electrode; and
- a charge accumulation region disposed in the first substrate section. The pixel region includes:
- first through-holes that penetrate the first substrate section; and
- first penetrating electrodes, each of the first penetrating electrodes being disposed in a corresponding first through-hole of the first through-holes and electrically connecting the first electrode to the charge accumulation region. The peripheral region includes:
- second through-holes that penetrate the second substrate section; and
- second penetrating electrodes, each of the second penetrating electrodes being disposed in a corresponding second through-hole of the second through-holes. An areal density of the first penetrating electrodes that is a ratio of an area of the first penetrating electrodes to an area of the pixel region is different from an areal density of the second penetrating electrodes that is a ratio of an area of the second penetrating electrodes to an area of the peripheral region.

The technique related to the disclosure may be appropriate for mass-producing imaging apparatuses that meet requested specifications of the pixel region and requested specifications of the peripheral region.

The imaging apparatus according to a second aspect of the disclosure in view of the first aspect may further include an electrical path that is electrically isolated from the first penetrating electrodes and includes the second penetrating electrodes,
wherein the electrical path may not pass through the first substrate section and may be electrically connected to a specific portion of the pixel region.

According to the second aspect, cross-talk between the electrical path and the first penetrating electrodes may be more easily controlled than when an electrical path is disposed passing through the first substrate section and reaching the specific portion.

The imaging apparatus according to a third aspect of the disclosure in view of the second aspect may further include a shield electrode electrically isolated from the first electrode, wherein
the photoelectric conversion layer may be disposed between the shield electrode and the second electrode, and
the specific portion may be included in the shield electrode or the second electrode.

The shield electrode or the second electrode according to the third aspect is an example of an element that may include the specific portion.

In the imaging apparatus according to a fourth aspect of the disclosure according to one of the first through third aspects,
a cross-sectional shape of each of the first penetrating electrodes may be different from a cross-sectional shape of each of the second penetrating electrodes.

The difference between the cross-sectional shapes of the penetrating electrodes according to the fourth aspect may lead to implementing the requested specifications of the pixel region and the peripheral region.

In the imaging apparatus according to a fifth aspect of the disclosure in view of the fourth aspect,
the cross-sectional shape of each of the first penetrating electrodes may be closer to a circle than the cross-sectional shape of each of the second penetrating electrodes and
the cross-sectional shape of each of the second penetrating electrodes may be closer to a rectangle than the cross-sectional shape of each of the first penetrating electrodes.

The imaging apparatus according to the fifth aspect may beneficially control the superimposition of noise onto charges flowing through the first penetrating electrode in the pixel region while also beneficially permitting a higher current to flow between an element on a first surface and an element on a second surface of the second substrate section in the peripheral region.

In the imaging apparatus according to a sixth aspect of the disclosure in view of one of the fourth and fifth aspects, the peripheral region may further include a plurality of wiring lines disposed within the second substrate section,
each of the second penetrating electrodes may be located between two corresponding wiring lines of the wiring lines,
a rectangle having a minimum area surrounding the cross-sectional shape of each of the first penetrating electrodes may have a first side and a second side equal to or longer in length than the first side,
a rectangle having a minimum area surrounding the cross-sectional shape of each of the second penetrating electrodes may have a third side and a fourth side equal to or longer in length than the third side,
a ratio of a length of the second side to a length of the first side may be defined as a first ratio,
a ratio of a length of the fourth side to a length of the third side may be defined as a second ratio, and
the first ratio may be lower than the second ratio.

The imaging apparatus according to the sixth aspect may beneficially control the superimposition of noise onto the charges flowing through the first penetrating electrode in the pixel region while also beneficially permitting the higher current to flow between the element on the first surface and the element on the second surface of the second substrate section in the peripheral region.

In the imaging apparatus according to a seventh aspect of the disclosure in view of one of the first through sixth aspects,
a cross-sectional area of each of the first penetrating electrodes may be different from a cross-sectional area of each of the second penetrating electrodes.

The difference between the cross-sectional areas of the penetrating electrodes according to the seventh aspect may lead to implementing the requested specifications of the pixel region and the peripheral region.

In the imaging apparatus according to an eighth aspect of the disclosure in view of the seventh aspect,
the cross-sectional area of each of the first penetrating electrodes may be smaller than the cross-sectional area of each of the second penetrating electrodes.

The imaging apparatus according to the eighth aspect may beneficially control the superimposition of noise onto the charges flowing through the first penetrating electrode in the pixel region while also beneficially permitting the higher current to flow between the element on the first surface and the element on the second surface of the second substrate section in the peripheral region.

In the imaging apparatus according to a ninth aspect of the disclosure in view of one of the first through eighth aspects,
an outline length of a cross section of each of the first penetrating electrodes may be different from an outline length of a cross section of each of the second penetrating electrodes.

The difference between the outline lengths of the cross-sections of the penetrating electrodes according to the ninth aspect may lead to implementing the requested specifications of the pixel region and the peripheral region.

In the imaging apparatus according to a tenth aspect of the disclosure in view of the ninth aspect,
the outline length of the cross section of each of the first penetrating electrodes may be shorter than the outline length of the cross section of each of the second penetrating electrodes.

The imaging apparatus according to the tenth aspect may beneficially control the superimposition of noise onto the charges flowing through the first penetrating electrode in the pixel region while also beneficially permitting the higher current to flow between the element on the first surface and the element on the second surface of the second substrate section in the peripheral region.

In the imaging apparatus according to an eleventh aspect of the disclosure in view of one of the first through tenth aspects,
a number density of the first penetrating electrodes in the pixel region may be different from a number density of the second penetrating electrodes in the peripheral region.

The difference between the number densities of the penetrating electrodes according to the eleventh aspect may lead to implementing the requested specifications of the pixel region and the peripheral region.

In the imaging apparatus according to a twelfth aspect of the disclosure in view of the eleventh aspect,
the number density of the first penetrating electrodes in the pixel region may be smaller than the number density of the second penetrating electrodes in the peripheral region.

The imaging apparatus according to the twelfth aspect may beneficially control the superimposition of noise onto the charges flowing through the first penetrating electrode in the pixel region while also beneficially permitting the higher current to flow between the element on the first surface and the element on the second surface of the second substrate section in the peripheral region.

In the imaging apparatus according to a thirteenth aspect of the disclosure in view of one of the first through twelfth aspects,
the areal density of the first penetrating electrodes may be smaller than the areal density of the second penetrating electrodes.

The imaging apparatus according to the thirteenth aspect may beneficially control the superimposition of noise onto the charges flowing through the first penetrating electrode in the pixel region while also beneficially permitting the higher current to flow between the element on the first surface and the element on the second surface of the second substrate section in the peripheral region.

In the imaging apparatus according to a fourteenth aspect of the disclosure in view of one of the first through thirteenth aspects,
a material of the first penetrating electrodes may be different from a material of the second penetrating electrodes.

The difference between the materials of the penetrating electrodes according to the fourteenth aspect may lead to implementing the requested specifications of the pixel region and the peripheral region.

In the imaging apparatus according to a fifteenth aspect of the disclosure in view of the fourteenth aspect,
the first penetrating electrodes may not substantially contain copper and
the second penetrating electrodes may contain copper as a principal ingredient.

The imaging apparatus according to the fifteenth aspect may beneficially control diffusion of copper in the pixel region while also beneficially permitting the higher current to flow between the element on the first surface and the element on the second surface of the second substrate section in the peripheral region.

In the imaging apparatus according to a sixteenth aspect of the disclosure in view of one of the first through fifteenth aspects,
the peripheral region may include a first adjacent region that is disposed adjacent to the pixel region at a side of the pixel region perpendicular to a first direction in a plan view and a second adjacent region that is disposed adjacent to the pixel region at a side of the pixel region perpendicular to a second direction in a plan view, and
a ratio of a mean value of arrangement intervals of the second penetrating electrodes in the first adjacent region to a mean value of arrangement intervals of the second penetrating electrodes in the second adjacent region may be 0.8 or higher and 1.2 or lower.

According to the sixteenth aspect, a current supply capability per unit length of the first adjacent region in the second direction may be more easily equalized to a current supply capability per unit length of the second adjacent region in the first direction.

The imaging apparatus according to a seventeenth aspect of the disclosure in view of one of the first through sixteenth aspects may further include
a shield electrode electrically isolated from the first electrode, wherein
the second penetrating electrodes may include at least one third penetrating electrode and at least one fourth penetrating electrode, the at least one third penetrating electrode electrically isolated from the at least one fourth penetrating electrode,
the photoelectric conversion layer may be disposed between the shield electrode and the second electrode, and
the at least one third electrode may be electrically connected to the shield electrode.

According to the seventeenth aspect, a connection destination of the third penetrating electrode may be electrically isolated from a connection destination of the fourth penetrating electrode.

The third penetrating electrode according to the seventeenth aspect may electrically connect the shield electrode to an element disposed at an opposite side from the shield electrode when viewed from the second substrate section.

In the imaging apparatus according to an eighteenth aspect of the disclosure in view of the seventeenth aspect, the at least one fourth penetrating electrode may be electrically connected to the second electrode.

The fourth penetrating electrode according to the eighteenth aspect may electrically connect the second electrode to an element disposed at an opposite side from the second electrode when viewed from the second substrate section.

In the imaging apparatus according to a nineteenth aspect of the disclosure in view of one of the seventeen and eighteenth aspects, the at least one third penetrating electrode may include a plurality of third penetrating electrodes, the at least one fourth penetrating electrode may include a plurality of fourth penetrating electrodes, and a number density of the plurality of third penetrating electrodes in the peripheral region may be different from a number density of the plurality of fourth penetrating electrodes in the peripheral region.

The difference between the number densities of the penetrating electrodes according to the nineteenth aspect may lead to implementing the requested specifications of the connection destination of the third penetrating electrode and the connection destination of the fourth penetrating electrode. An imaging apparatus according to a twentieth aspect of the disclosure includes:

a pixel region including a first substrate section and pixels; and a peripheral region including a second substrate section and no pixels. The first substrate section and the second substrate section are included in a single semiconductor substrate. Each of the pixels includes:

a first electrode;

a second electrode;

a photoelectric conversion layer that is disposed between the first electrode and the second electrode; and a charge accumulation region disposed in the first substrate section. The pixel region includes:

first through-holes that penetrate the first substrate section; and first penetrating electrodes, each of the first penetrating electrodes being disposed in a corresponding first through-hole of the first through-holes and electrically connecting the first electrode to the charge accumulation region. The peripheral region includes:

second through-holes that penetrate the second substrate section; and second penetrating electrodes, each of the second penetrating electrodes being disposed in a corresponding second through-hole of the second through-holes. A cross-sectional area of each of the first penetrating electrodes is smaller than a cross-sectional area of each of the second penetrating electrodes.

In the imaging apparatus according to a twenty-first aspect of the disclosure in view of one of the first through twentieth aspects, the peripheral region may include a first adjacent region that is disposed adjacent to the pixel region at a side of the pixel region perpendicular to a first axis in a plan view and a second adjacent region that is disposed adjacent to the pixel region at a side of the pixel region perpendicular to a second axis in a plan view, and a length of the first adjacent region in the second axis may be shorter than a length of the second adjacent region in the first axis, and a mean value of arrangement intervals of the second penetrating electrodes in the first adjacent region may be lower than a mean value of arrangement intervals of the second penetrating electrodes in the second adjacent region.

According to the twenty-first aspect, a current supply capability per unit length of the first adjacent region as a whole may be more easily equalized to a current supply capability per unit length of the second adjacent region as a whole.

In the imaging apparatus according to a twenty-second aspect of the disclosure in view of one of the seventeenth through nineteenth aspects, a cross-sectional shape of the at least one third penetrating electrode may be different from a cross-sectional shape of the at least one fourth penetrating electrode.

The difference between the cross-sectional shapes of the penetrating electrodes according to the twenty-second aspect may lead to implementing the requested specifications of a connection destination of the third penetrating electrode and a connection destination of the fourth penetrating electrode.

In the imaging apparatus according to a twenty-third aspect of the disclosure in view of one of the seventeenth and nineteenth aspects, the at least one third penetrating electrode may include a plurality of third penetrating electrodes in the peripheral region, the at least one fourth penetrating electrode may include a plurality of fourth penetrating electrodes in the peripheral region, and an areal density of the plurality of third penetrating electrodes in the peripheral region may be different from an areal density of the plurality of fourth penetrating electrodes in the peripheral region.

The difference between the areal densities of the penetrating electrodes according to the twenty-third aspect may lead to implementing the requested specifications of the connection destination of the third penetrating electrode and the connection destination of the fourth penetrating electrode.

In the imaging apparatus according to a twenty-fourth aspect of the disclosure in view of one of the seventeen and nineteenth aspects, the peripheral region may include a first adjacent region that is disposed adjacent to the pixel region at a side of the pixel region perpendicular to a first direction in a plan view, the at least one third penetrating electrode may include a plurality of third penetrating electrodes in the first adjacent region, the at least one fourth penetrating electrode may include a plurality of fourth penetrating electrodes in the first adjacent region, a mean value of arrangement intervals of the plurality of third penetrating electrodes in the first adjacent region may be different from a mean value of arrangement intervals of the plurality of fourth penetrating electrodes in the first adjacent region.

The difference between the mean values of the arrangement intervals of the penetrating electrodes according to the twenty-fourth aspect may lead to implementing the requested specifications of the connection destination of the third penetrating electrode and the connection destination of the fourth penetrating electrode.

Embodiment of the disclosure is described below with reference to the drawings. The embodiment is not intended to limit the disclosure.

In the context of the specification, terms "above," "below," and the like are used to specify arrangement configuration between components and not intended to restrict an posture of each component in the use of the imaging apparatus.

In the context of the specification, term "plan view" refers to a view when viewed in a direction of the thickness of a first substrate section or a direction of the thickness of a second substrate section.

In the context of the specification, term "rectangle" includes the concept of a square shape.

In the context of the specification, term "resistor" refers to electrical resistance.

In the discussion that follows, term "principal ingredient" refers to a component that is contained in the highest amount by weight. As an example, the principal ingredient is a component exceeding 50% by weight. As another example, the principal ingredient is a component exceeding 80% by weight.

In the discussion that follows, expression "substantially not containing" signifies that the concentration of a component of interest is less than 1% by weight. Specifically, the expression signifies that the concentration of the component of interest is less than 0.1% by weight.

In the embodiment, parts may be appropriately modified when polarities of signal charges are changed, for example, when conductivity type of an impurity region is changed. The change of the polarity may also involve the change of terms in use.

Embodiment

Configuration of Imaging Apparatus

FIG. 1 illustrates a configuration of an imaging apparatus 100 of an embodiment. The imaging apparatus 100 illustrated in FIG. 1 includes a pixel region 101 and a peripheral region 102.

The pixel region 101 includes a first substrate section. The peripheral region 102 includes a second substrate section. The first substrate section is a first semiconductor substrate section. The second substrate section is a second semiconductor substrate section. According to the embodiment, the first substrate section and the second substrate section are mutually different portions of a single substrate in a plan view. It may also be acceptable as an exemplary configuration that the first substrate section is a substrate and the second substrate section is a different substrate.

Pixels 10 are disposed in the pixel region 101. The pixel 10 has a photoelectric converter. The photoelectric converter converts incident light into charges.

The pixel region 101 of the embodiment includes multiple pixels 10. The pixels 10 form a pixel array PA. According to the embodiment, the pixels 10 are two-dimensionally arranged. The pixels 10 may be one-dimensionally arranged. In such a case, the imaging apparatus 100 serves as a line sensor.

Specifically, according to the embodiment, the pixels 10 are arranged in a matrix of m rows and n columns. The center of each pixel 10 is located at the grid point of a square lattice. The arrangement of the pixels 10 is not limited to the arrangement illustrated as illustrated in FIG. 1. The center of each pixel 10 may be located at the grid point of a triangular lattice or a hexagonal lattice.

The peripheral region 102 includes peripheral circuits 90. The peripheral circuits 90 control the pixels 10. Referring to FIG. 1, the peripheral circuits 90 includes a row scanning circuit 91, a signal processing circuit 92, an output circuit 93, and a control circuit 94.

The row scanning circuit 91 is also referred to as a vertical scanning circuit. The row scanning circuit 91 is connected to the row control lines $R_0, R_1, \ldots, R_i, \ldots, R_{m-1}$. The row control lines $R_0, R_1, \ldots, R_i, \ldots, R_{m-1}$ respectively correspond to rows of the pixels 10.

The pixels 10 at the i-th row is connected to the row control line $R_i$. The row scanning circuit 91 is connected to the pixels 10 at the i-th row via the row control line $R_i$. Herein, i is any integer falling within a range of 0 or higher and (m−1) or lower.

The row scanning circuit 91 selects the pixels 10 by a unit of row, reading a signal voltage and resetting the photoelectric converter in each pixel.

FIG. 1 simply illustrates a connection between each pixel 10 and the row scanning circuit 91. The number of control lines arranged on each row of the pixels 10 is not limited to one. Two or more control lines may be connected to each row in the imaging apparatus 100. For example, the row scanning circuit 91 may be connected to multiple reset control lines and the reset control lines corresponding to each row of the pixels 10 may be arranged.

The signal processing circuit 92 is connected to the output signal lines $S_0, S_1, \ldots, S_j, \ldots, S_{n-1}$. The output signal lines $S_0, S_1, \ldots, S_j, \ldots, S_{n-1}$ respectively correspond to columns of the pixels 10.

The pixels 10 at the j-th column is connected to the output signal line $S_j$. The signal processing circuit 92 is connected via the output signal line $S_j$ to pixels 10 belonging to the j-th column. Herein, j is any integer falling within a range of 0 or higher and (n−1) or lower.

Outputs of the pixels 10 are selected on a per row basis by the row scanning circuit 91 and read by the signal processing circuit 92 via the output signal lines $S_0$ through $S_{n-1}$. The signal processing circuit 92 performs noise suppression signal processing and analog-to-digital conversion on an outputs signal read from the pixels 10. An example of the noise suppression signal processing is correlated double sampling. The output of the signal processing circuit 92 is read to the outside of the imaging apparatus 100 via the output circuit 93.

According to the embodiment, the control circuit 94 receive instruction data, clock, and the like from the outside of the imaging apparatus 100. The control circuit 94 controls the whole imaging apparatus 100 in response to these signals.

Typically, the control circuit 94 includes a timing generator. The control circuit 94 thus supplies drive signals to the row scanning circuit 91, the signal processing circuit 92, and the like.

Device Structure

FIG. 2 is a cross-sectional view schematically illustrating a device structure of the pixel region 101 and the peripheral region 102. The device structure of these elements is described with reference to FIG. 2. In the following discussion, term "first conductivity type" is used. According to the embodiment, the first conductivity type is n-type, and second conductivity type is p-type. Alternatively, the first conductivity type may be p-type and the second conductivity type may be n-type.

The device structure of the pixel region 101 is described below.

The pixel 10 may include an insulation layer 71, an insulation layer 70, a first substrate section 1, an insulation layer 32, a photoelectric converter 12, an insulation layer 31, a color filter 35, and a microlens 30. The insulation layer 71, the insulation layer 70, the first substrate section 1, the insulation layer 32, the photoelectric converter 12, the insulation layer 31, the color filter 35, and the microlens 30 are laminated in this order. Specifically, these elements are laminated in the direction of the thickness of the first substrate section 1. The pixel 10 further includes a first penetrating electrode 81, an insulation layer 33, and a shield electrode 16.

The first substrate section 1 may be, for example, part of a silicon substrate. The first substrate section 1 has a first principal surface 1A and a second principal surface 1B.

According to the embodiment, the first principal surface 1A is a back surface. The first principal surface 1A serves as a surface on which light is incident. The second principal surface 1B is a front surface. The second principal surface 1B is a surface opposite from the side on which light is incident. According to the embodiment, the first principal surface 1A and the second principal surface 1B extend in a direction perpendicular to the direction of the thickness of the first substrate section 1.

Referring to FIG. 2, the first substrate section 1 includes an impurity region 1$i$ of the second conductivity type. The impurity region 1$i$ may be a p+ region or an n+ region. The symbol "+" signifies that the impurity concentration of the p type or the n type is higher. The impurity region 1$i$ has the first principal surface 1A. The impurity region 1$i$ has part of the second principal surface 1B.

The first substrate section 1 includes a reset transistor 26, a signal detecting transistor 22, and a transfer transistor 28. Specifically, the reset transistor 26, the signal detecting transistor 22, and the transfer transistor 28 are formed on the second principal surface 1B.

In the embodiment, the reset transistor 26, the signal detecting transistor 22, and the transfer transistor 28 are metal oxide semiconductor field effect transistors (MOSFETs). Specifically, the reset transistor 26, the signal detecting transistor 22, and the transfer transistor 28 are N-channel MOSFETs.

The reset transistor 26 includes a first diffusion region 67$n$ as one of a source and a drain. The reset transistor 26 includes a second diffusion region 68$an$ as the other of the source and the drain. The reset transistor 26 further includes a gate electrode 26$e$ and the insulation layer 70. The insulation layer 70 is interposed between the gate electrode 26$e$ and the first substrate section 1.

The signal detecting transistor 22 includes a third diffusion region 68$bn$ as one of a source and a drain. The signal detecting transistor 22 includes a fourth diffusion region 68$cn$ as the other of the source and the drain. The signal detecting transistor 22 further includes a gate electrode 22$e$ and the insulation layer 70. The insulation layer 70 is interposed between the gate electrode 22$e$ and the first substrate section 1. The signal detecting transistor 22 may also be referred to as an amplification transistor.

The transfer transistor 28 includes a fifth diffusion region 68$dn$ as one of a source and a drain. The other of the source and the drain of the transfer transistor 28 is connected to a photodiode 27. The transfer transistor 28 also includes a gate electrode 28$e$ and the insulation layer 70. The insulation layer 70 is interposed between the gate electrode 28$e$ and the first substrate section 1.

The first diffusion region 67$n$, the second diffusion region 68$an$, the third diffusion region 68$bn$, the fourth diffusion region 68$cn$, and the fifth diffusion region 68$dn$ are disposed within the first substrate section 1. The first diffusion region 67$n$, the second diffusion region 68$an$, the third diffusion region 68$bn$, the fourth diffusion region 68$cn$, and the fifth diffusion region 68$dn$ contain an impurity of the first conductivity type.

The first diffusion region 67$n$ corresponds to a charge accumulation region FD. The first diffusion region 67$n$ accumulates charges generated through photoelectric conversion in the photoelectric converter 12. The charge accumulation region FD may be referred to as a first charge accumulation region FD.

The fifth diffusion region 68$dn$ corresponds to a second charge accumulation region FD2. The fifth diffusion region 68$dn$ accumulates charges generated through the photoelectric conversion performed by the photodiode 27.

The photoelectric converter 12 includes a pixel electrode 13, a photoelectric conversion layer 14, and a counter electrode 15. The counter electrode 15 faces the pixel electrode 13. The photoelectric conversion layer 14 is interposed between the pixel electrode 13 and the counter electrode 15.

The photoelectric conversion layer 14 has a film-like structure. The photoelectric conversion layer 14 includes a component selected from the group consisting of an organic material and an inorganic material. For example, the inorganic material is amorphous silicon. In response to the reception of light incident via the counter electrode 15, the photoelectric conversion layer 14 generates positive or negative charges through the photoelectric conversion. Typically, the photoelectric conversion layer 14 extends across multiple pixels 10. The photoelectric conversion layer 14 may include a layer manufactured of the organic material and a layer manufactured of the inorganic material.

The counter electrode 15 is a transparent electrode. Specifically, the counter electrode 15 is manufactured of an electrically conductive transparent material, such as indium tin oxide (ITO). The counter electrode 15 is disposed on the light-incident side of the photoelectric conversion layer 14. Typically, like the photoelectric conversion layer 14, the counter electrode 15 extends across multiple pixels 10.

Since a potential of the counter electrode 15 is differentiated from a potential of the pixel electrode 13 by controlling the potential of the counter electrode 15 when the imaging apparatus 100 is active, signal charges generated through the photoelectric conversion may be collected by the pixel electrode 13.

According to the embodiment, the signal charges are negative, specifically, electrons. Typically, the potential of the counter electrode 15 is controlled to be lower than the potential of the pixel electrode 13. In this way, electrons of hole-electron pairs generated in the photoelectric conversion layer 14 are collected by the pixel electrode 13. The signal charges collected by the pixel electrode 13 are accumulated in the first diffusion region 67$n$ via the first penetrating electrode 81 and a wiring structure 80.

Alternatively, the signal charges may be positive, specifically, holes. Typically, the potential of the counter electrode 15 is controlled to be higher than the potential of the pixel electrode 13. In this way, holes of hole-electron pairs generated in the photoelectric conversion layer 14 are collected by the pixel electrode 13. The signal charges collected by the pixel electrode 13 are also accumulated in the first diffusion region 67$n$ via the first penetrating electrode 81 and the wiring structure 80.

The pixel electrode 13 is a transparent electrode. Specifically, the pixel electrode 13 is manufactured of an electrically conductive transparent material, such as ITO. The pixel electrode 13 is spaced apart from the pixel electrodes 13 of the other adjacent pixels 10 and thus electrically isolated from the pixel electrodes 13 of the other adjacent pixels 10.

The shield electrode 16 is disposed on the same side as the pixel electrode 13 when viewed from the photoelectric conversion layer 14. The shield electrode 16 is spaced apart from the pixel electrode 13. The shield electrode 16 is electrically isolated from the pixel electrode 13.

In a plan view, the shield electrode 16 includes a section between the pixel electrode 13 in a pixel 10 and the pixel electrode 13 in another pixel 10 adjacent to that pixel 10. The section of the shield electrode 16 collects charges generated through the photoelectric conversion of the photoelectric conversion layer 14. The shield electrode 16 may thus control the intrusion of noise to the charge accumulation region FD.

The material of the shield electrode 16 may be a material that may also serve as a material of the pixel electrode 13. The shield electrode 16 may or may not be manufactured of the same material as the pixel electrode 13.

FIG. 3 is a plan view of the shield electrodes 16. The shield electrodes 16 have a grid-like structure in a plan view. Each space defined by the grid-like structure accommodates the pixel electrode 13. The grid-like structure straddles across multiple pixels 10. Referring to FIG. 3, some of elements in the imaging apparatus 100 are not illustrated.

Referring back to FIG. 2, the microlens 30 has a light-gathering feature. Light incident on the microlens 30 is supplied to the photoelectric converter 12 via the color filter 35. The photoelectric converter 12 converts the supplied light.

The insulation layer 31 is interposed between the color filter 35 and the photoelectric converter 12. The insulation layer 31 works as a protective layer protecting the photoelectric converter 12.

An insulation layer 32 is interposed between the pixel electrode 13 and the first substrate section 1. The insulation layer 32 is also interposed between the shield electrode 16 and the first substrate section 1.

The first substrate section 1 includes the photodiode 27 and a well 29. The photodiode 27 is of the first conductivity type. The well 29 is of the second conductivity type. Referring to FIG. 2, the impurity region 1$i$ is bent in a cross section in parallel with the direction of the thickness of the first substrate section 1, thus forming a cavity. The photodiode 27 is housed in the cavity. The well 29 has a through-hole and the first penetrating electrode 81 is inserted into the through-hole.

The photodiode 27 is sensitive to light. The photodiode 27 is housed in the first substrate section 1. The photodiode 27 photoelectrically converts light within a wavelength range of color that is not absorbed by the photoelectric converter 12.

When light is incident on the photodiode 27, charges are generated in the photodiode 27. Generated charges are accumulated as signal charges in the photodiode 27. According to the embodiment, the signal charges are negative. Specifically, the signal charges are electrons. The photodiode 27 is an impurity layer of the first conductivity type. Alternatively, it is also acceptable that the signal charges of the photodiode 27 is positive, specifically, holes.

The transfer transistor 28 transfers the signal charges accumulated in the photodiode 27 to the second charge accumulation region FD2.

A transfer signal line, though not illustrated in FIG. 2, is connected to the gate electrode 28$e$ of the transfer transistor 28. A transfer signal that controls the on-off operation of the transfer transistor 28 and is applied to the gate electrode 28$e$ via the transfer signal line turns the transfer transistor 28 on.

With the transfer transistor 28 turned on, the signal charges accumulated in the photodiode 27 are transferred to the second charge accumulation region FD2.

The wiring structure 80 is disposed within the insulation layer 71. Referring to FIG. 2, the wiring structure 80 includes a first wiring line 80$a$ and a second wiring line 80$b$.

The wiring structure 80 typically includes a component selected from the group consisting of a metal and a metallic compound. For example, the metal may be copper or tungsten. The metallic compound may be metal nitride or metal oxide. The same is true of the first wiring line 80$a$ and the second wiring line 80$b$.

The insulation layer 71 includes a first contact plug cp1, a second contact plug cp2, a third contact plug cp3, a fourth contact plug cp4, a fifth contact plug cp5, a sixth contact plug cp6, and a seventh contact plug cp7. The insulation layer 71 also includes the gate electrode 26$e$, the gate electrode 22$e$, and the gate electrode 28$e$.

Typically, each of the first contact plug cp1, the second contact plug cp2, the third contact plug cp3, the fourth contact plug cp4, the fifth contact plug cp5, the sixth contact plug cp6, and the seventh contact plug cp7 contains a semiconductor material. According to the embodiment, each of the first contact plug cp1, the second contact plug cp2, the third contact plug cp3, the fourth contact plug cp4, the fifth contact plug cp5, the sixth contact plug cp6, and the seventh contact plug cp7 is a polysilicon layer doped with an impurity of the first conductivity type. Alternatively, the semiconductor material contained in each of the first contact plug cp1, the second contact plug cp2, the third contact plug cp3, the fourth contact plug cp4, the fifth contact plug cp5, the sixth contact plug cp6, and the seventh contact plug cp7 may be polycrystalline silicon, germanium, or the like. Each of the first contact plug cp1, the second contact plug cp2, the third contact plug cp3, the fourth contact plug cp4, the fifth contact plug cp5, the sixth contact plug cp6, and the seventh contact plug cp7 may contain metal in place of the semiconductor material or both metal and the semiconductor material.

The first substrate section 1 includes a first through-hole 82. Specifically, the first principal surface 1A and the second principal surface 1B of the first substrate section 1 has openings that communicate with each other via the first through-hole 82. Specifically, the first through-hole 82 extends in the direction of the thickness of the first substrate section 1.

The first penetrating electrode 81 is disposed in the first through-hole 82. The first penetrating electrode 81 electrically connects elements that are spaced apart by the first substrate section 1 in the direction of the thickness of the first substrate section 1.

The first penetrating electrode 81 typically contains a component selected from the group consisting of a metal and a metallic compound. The metal may be copper, tungsten, or the like. The metallic compound may be metal nitride, metal oxide, or the like. The first penetrating electrode 81 includes the same semiconductor material as the semiconductor material contained in the first substrate section 1 and may contain an impurity of the first conductivity type or the second conductivity type. The semiconductor material that may be contained in the first substrate section 1 and the first penetrating electrode 81 may be silicon, polycrystalline silicon, germanium, or the like.

The insulation layer 33 extends in the direction along which the first penetrating electrode 81 extends. In a plan view, the insulation layer 33 surrounds the first penetrating electrode 81. Specifically, in a plan view, the insulation layer 33 surrounds the first penetrating electrode 81 without any gap therebetween.

The pixel electrode 13, the first penetrating electrode 81, the first contact plug cp1, the second wiring line 80b, the second contact plug cp2, and the charge accumulation region FD are electrically connected in this order. For this reason, the signal charges are conveyed to the charge accumulation region FD from the pixel electrode 13 via the first penetrating electrode 81, the first contact plug cp1, the second wiring line 80b, and the second contact plug cp2 in this order. Specifically, the holes or electrons as the signal charges are conveyed from the pixel electrode 13 to the charge accumulation region FD via the first penetrating electrode 81, the first contact plug cp1, the second wiring line 80b, and the second contact plug cp2 in this order.

The charge accumulation region FD, the second contact plug cp2, the second wiring line 80b, the fifth contact plug cp5, and the gate electrode 22e of the signal detecting transistor 22 are electrically connected in this order. The signal charges are conveyed from the charge accumulation region FD to the gate electrode 22e via the second contact plug cp2, the second wiring line 80b, the fifth contact plug cp5 in this order.

The third contact plug cp3 electrically connects the second diffusion region 68an to the first wiring line 80a. The charges are thus conveyed from the second diffusion region 68an to the first wiring line 80a via the third contact plug cp3.

The third diffusion region 68bn is electrically connected to the fourth contact plug cp4. Charges are thus permitted to flow from the third diffusion region 68bn to the fourth contact plug cp4. Wiring lines connected to the fourth contact plug cp4 are not illustrated.

The fourth diffusion region 68cn is electrically connected to the sixth contact plug cp6. Charges are thus permitted to flow from the fourth diffusion region 68cn to the sixth contact plug cp6. Wiring lines connected to the sixth contact plug cp6 are not illustrated.

The fifth diffusion region 68dn, namely, the second charge accumulation region FD2, is connected to the seventh contact plug cp7. Charges are thus permitted to flow from the fifth diffusion region 68dn to the seventh contact plug cp7. Wiring lines connected to the seventh contact plug cp7 are not illustrated.

Referring to FIG. 2, the first penetrating electrode 81 is connected to the second wiring line 80b via the first contact plug cp1. Alternatively, the first penetrating electrode 81 may be directly connected to the second wiring line 80b.

As illustrated in FIG. 2, the first penetrating electrode 81 is directly connected to the pixel electrode 13. Alternatively, the first penetrating electrode 81 may be connected to the pixel electrode 13 via a plug or the like.

The device structure of the peripheral region 102 is described below.

The peripheral region 102 includes an insulation layer 73, an insulation layer 72, and a second substrate section 2. The insulation layer 73, the insulation layer 72, and the second substrate section 2 are laminated in this order. Specifically, these elements are laminated in the direction of the thickness of the second substrate section 2. The peripheral region 102 further includes a second penetrating electrode 83 and a connection electrode 17.

The second substrate section 2 is, for example, part of the silicon substrate. The second substrate section 2 has a first principal surface 2A and a second principal surface 2B. The first principal surface 2A is a front surface. The second principal surface 2B is a back surface. According to the embodiment, the first principal surface 2A and the second principal surface 2B extend in a direction perpendicular to the direction of the thickness of the second substrate section 2.

The insulation layer 73 includes a third wiring line 80c, a fourth wiring line 80d, an eighth contact plug cp8, and a ninth contact plug cp9.

The material of the third wiring line 80c and the fourth wiring line 80d is a material that may serve as the material of the first wiring line 80a and the second wiring line 80b.

The material of the eighth contact plug cp8 and the ninth contact plug cp9 is a material that may serve as the material of each of the first contact plug cp1, the second contact plug cp2, the third contact plug cp3, the fourth contact plug cp4, the fifth contact plug cp5, the sixth contact plug cp6, and the seventh contact plug cp7.

The second substrate section 2 includes a second through-hole 87. Specifically, the first principal surface 2A and the second principal surface 2B of the second substrate section 2 have openings that communicate with each other via the second through-hole 87. Specifically, the second through-hole 87 extends in the direction of the thickness of the second substrate section 2.

The second penetrating electrode 83 is disposed in the second through-hole 87. The second penetrating electrode 83 electrically connects elements that are spaced apart from each other by the second substrate section 2 in the direction of the thickness of the second substrate section 2.

The material of the second penetrating electrode 83 is a material that may serve as the material of the first penetrating electrode 81.

The material of the connection electrode 17 is a material that may serve as the material of the shield electrode 16 or the counter electrode 15.

An insulation layer that is not illustrated in FIG. 2 and is similar to the insulation layer 33 surrounds the second penetrating electrode 83.

The first penetrating electrode 81 is electrically isolated from the second penetrating electrode 83.

According to the embodiment, the second substrate section 2 includes multiple second through-holes 87. Multiple second penetrating electrodes 83 are employed. Multiple connection electrodes 17 are employed.

The second through-holes 87 include at least one third through-hole 88 and at least one fourth through-hole 89. The second penetrating electrodes 83 include at least one third penetrating electrode 84 and at least one fourth penetrating electrode 85. The connection electrodes 17 includes at least one first connection electrode 18 and at least one second connection electrode 19.

The third wiring line 80c, the eighth contact plug cp8, the third penetrating electrode 84, the first connection electrode 18, and the shield electrode 16 are electrically connected in this order. Voltage is supplied to the shield electrode 16 via the third wiring line 80c, the eighth contact plug cp8, the third penetrating electrode 84, and the first connection electrode 18 in this order. The voltage supplied to the shield electrode 16 is referred to as shield voltage.

FIG. 3 illustrates a specific example of an electrical connection between the third penetrating electrode 84 and the shield electrode 16 via the first connection electrode 18. Referring to FIG. 3, the first connection electrode 18 is disposed in a manner such that the first connection electrode 18 surrounds the shield electrode 16 in a plan view, and the first connection electrode 18 is connected to the third penetrating electrodes 84. Symbols "x" in FIG. 3 schematically denote the third penetrating electrodes 84 in a plan view. Referring to FIG. 3, the shield electrode 16 is electrically connected to the first connection electrode 18 and a connection mark remains therebetween. Alternatively, the shield electrode 16 and the first connection electrode 18 may be a unitary electrode without any connection mark.

Referring back to FIG. 2, the fourth wiring line 80*d*, the ninth contact plug cp9, the fourth penetrating electrode 85, the second connection electrode 19, and the counter electrode 15 are electrically connected to each other in this order. Voltage may be supplied to the counter electrode 15 via the fourth wiring line 80*d*, the ninth contact plug cp9, the fourth penetrating electrode 85, and the second connection electrode 19 in this order. The voltage supplied to the counter electrode 15 may be referred to as counter voltage.

Figure 4A:
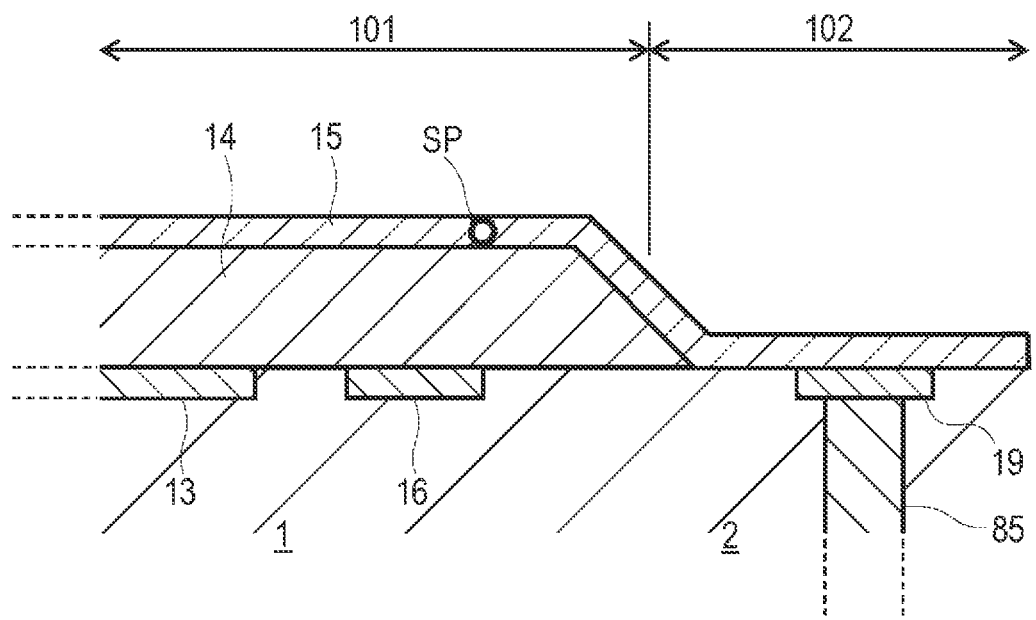
FIG. 4A is a cross-sectional view illustrating an electrical connection between a fourth penetrating electrode and a counter electrode.
Figure 4B:
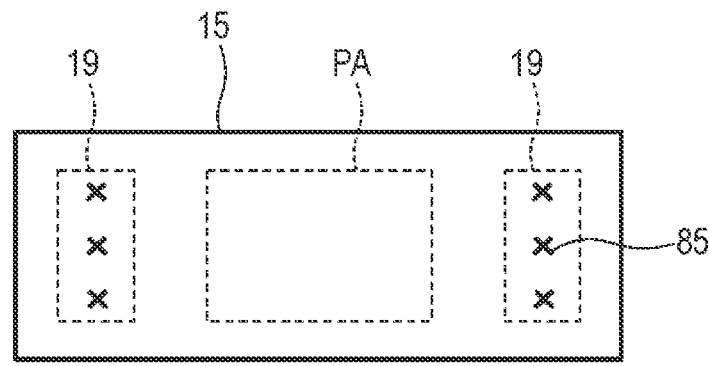
FIG. 4B is a plan view illustrating the electrical connection between the fourth penetrating electrode and the counter electrode.
Figure 4C:
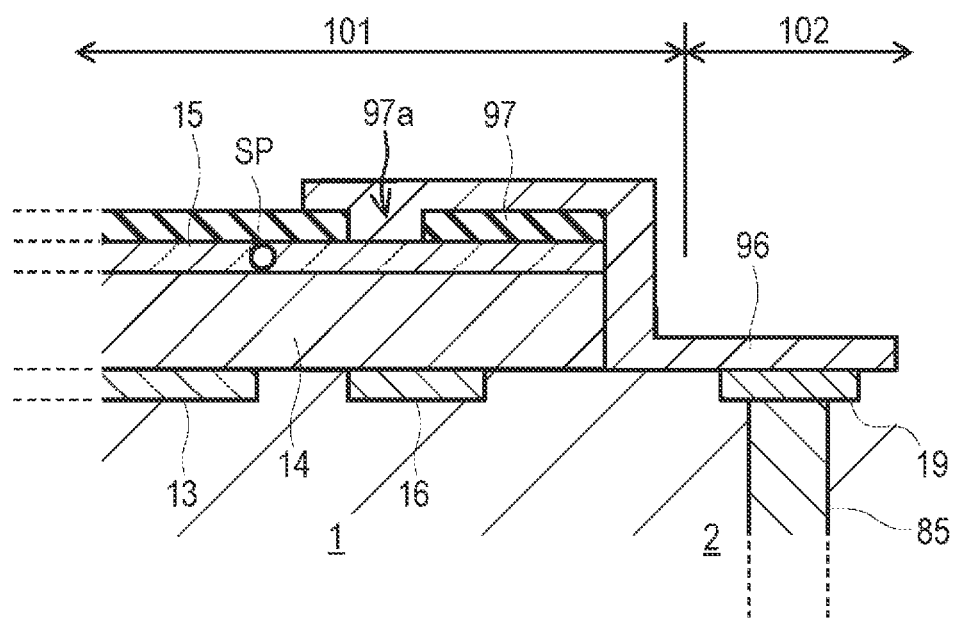
FIG. 4C is a cross-sectional view illustrating the electrical connection between the fourth penetrating electrode and the counter electrode.
Figure 4D:
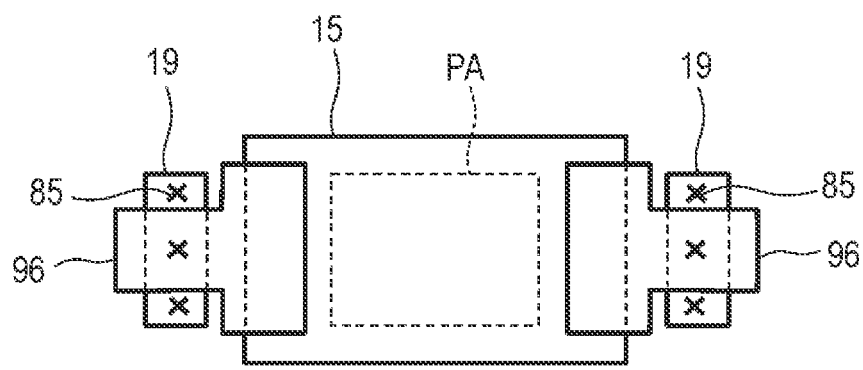
FIG. 4D is a plan view illustrating the electrical connection between the fourth penetrating electrode and the counter electrode.

FIG. 4A is a cross-sectional view of an example of an electrical connection between the fourth penetrating electrode 85 and the counter electrode 15. FIG. 4B is a plan view of the electrical connection in FIG. 4A. FIG. 4C is a cross-sectional view of another example of the electrical connection between the fourth penetrating electrode 85 and the counter electrode 15. FIG. 4D is a plan view of the electrical connection in FIG. 4C.

Referring to FIG. 4A through FIG. 4D, the first substrate section 1 and the second substrate section 2 are mutually different sections in a single common substrate in a plan view. Referring to FIG. 4A through FIG. 4D, some of the elements in the imaging apparatus 100 are not illustrated. For example, the shield electrode 16 is not illustrated in FIGS. 4B and FIG. 4D. Symbols "x" in FIG. 4B and FIG. 4D schematically illustrate the fourth penetrating electrode 85 in a plan view.

Referring to FIG. 4A and FIG. 4B, the counter electrode 15 straddles the border between the pixel region 101 and the peripheral region 102. A portion of the counter electrode 15 straddling the border between the pixel region 101 and the peripheral region 102 becomes closer to the common substrate as the distance from the pixel region 101 to the peripheral region 102 is farther. A portion of the counter electrode 15 belonging to the peripheral region 102 is connected to the fourth penetrating electrode 85 via the second connection electrode 19.

Referring to FIGS. 4C and 4D, a wiring layer 96 straddles the border between the pixel region 101 and the peripheral region 102. The counter electrode 15 is electrically connected to the fourth penetrating electrode 85 via the wiring layer 96 and the second connection electrode 19.

Specifically, referring to FIG. 4C and FIG. 4D, an insulation layer 97 is disposed on the counter electrode 15 in the pixel region 101. The insulation layer 97 has a through-hole 97*a*. The wiring layer 96 fills the through-hole 97*a*, thereby being in contact with the top surface of the counter electrode 15. The wiring layer 96 is also in contact with a side surface of the counter electrode 15. In this way, the wiring layer 96 is electrically connected to the counter electrode 15.

According to the embodiment, the first substrate section 1 and the second substrate section 2 are different sections of the single common substrate in a plan view. The first principal surface 1A is continuous to the first principal surface 2A. The second principal surface 1B is continuous to the second principal surface 2B. The insulation layer 70 and the insulation layer 72 may be a single unitary layer manufactured of the same material. The insulation layer 71 and the insulation layer 73 may be a single unitary layer manufactured of the same material.

According to the embodiment, the wiring structure 80 includes the first wiring line 80*a*, the second wiring line 80*b*, the third wiring line 80*c*, and the fourth wiring line 80*d*. The first wiring line 80*a*, the second wiring line 80*b*, the third wiring line 80*c*, and the fourth wiring line 80*d* form a wiring layer. The wiring structure 80 may include multiple layers.

The imaging apparatus 100 is further described. In the discussion that follows, terms "first electrode," and "second electrode" are used. According to the embodiment, the first electrode corresponds to the pixel electrode 13. The second electrode corresponds to the counter electrode 15. The feature of the pixel electrode 13 is applicable to the first electrode. The feature of the counter electrode 15 is applicable to the second electrode.

According to the embodiment, the imaging apparatus 100 includes the pixel region 101 and the peripheral region 102. The pixel region 101 includes the pixels 10. The peripheral region 102 includes the peripheral circuits 90. The peripheral circuits 90 control the pixels 10.

The pixel region 101 includes the first substrate section 1. The pixel 10 includes the first electrode, the second electrode, the photoelectric conversion layer 14, the charge accumulation region FD, the first through-hole 82, and the first penetrating electrode 81. The photoelectric conversion layer 14 is interposed between the first electrode and the second electrode. The charge accumulation region FD is disposed in the first substrate section 1. The first through-hole 82 is opened through the first substrate section 1. The first penetrating electrode 81 is disposed within the first through-hole 82. The first penetrating electrode 81 electrically connects the first electrode to the charge accumulation region FD.

The peripheral region 102 includes the second substrate section 2, the second through-hole 87, and the second penetrating electrode 83. The second through-hole 87 is opened through the second substrate section 2. The second penetrating electrode 83 is disposed within the second through-hole 87.

The first penetrating electrode 81 may electrically connect an element on a first surface to an element on a second surface of the first substrate section 1 in the pixel region 101. The second penetrating electrode 83 may electrically connect an element on a first surface to an element on a second surface of the second substrate section 2 in the peripheral region 102.

The first penetrating electrode 81 and the second penetrating electrode 83 have the same basic structure as a penetrating electrode. On the other hand, design freedom is assured in the design of the penetrating electrode. The design of the first penetrating electrode 81 may be adjusted in accordance with the requested specifications of the pixel region 101, and the design of the second penetrating electrode 83 may be adjusted in accordance with the requested specifications of the peripheral region 102. The configuration where the first penetrating electrode 81 is disposed in the pixel region 101 and the second penetrating electrode 83 is disposed in the peripheral region 102 may beneficially help mass-produce the imaging apparatus 100 that satisfies the requested specifications of the pixel region 101 and the requested specifications of the peripheral region 102.

Specifically, the first penetrating electrode 81 may be designed in view of charges that are generated through the photoelectric conversion of the pixel region 101 and flow through the first penetrating electrode 81 as a signal. The second penetrating electrode 83 may be designed in view of the peripheral region 102 that has the peripheral circuits 90.

The pixel region 101 is described below. If the number of first electrodes in the imaging apparatus 100 is one, the pixel region 101 indicates in a plan view an area that overlaps the single first electrode. If the imaging apparatus 100 has multiple first electrodes, the pixel region 101 indicates in a plan view an area that overlaps a minimum rectangle surrounding the first electrodes.

Depending on manufacturing method, the imaging apparatus 100 may include a dummy electrode that is not electrically connected to the charge accumulation region. An area where a dummy electrode is present with no first electrodes does not correspond to the pixel region 101.

According to the embodiment, each of the first substrate section 1 and the second substrate section 2 is part of the silicon substrate. According to the embodiment, the first penetrating electrode 81 and the second penetrating electrode 83 beneficially serve as through silicon via (TSV) respectively in the pixel region 101 and the peripheral region 102.

The peripheral region 102 is described below.

Figure 5A:
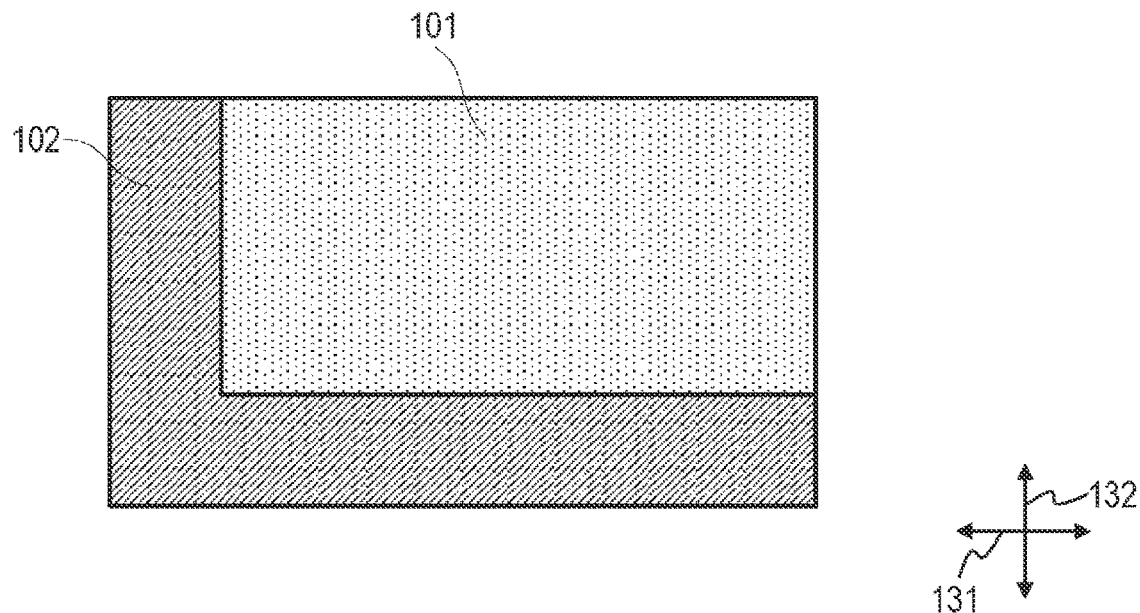
FIG. 5A is a plan view illustrating a pixel region and a peripheral region.
Figure 5B:
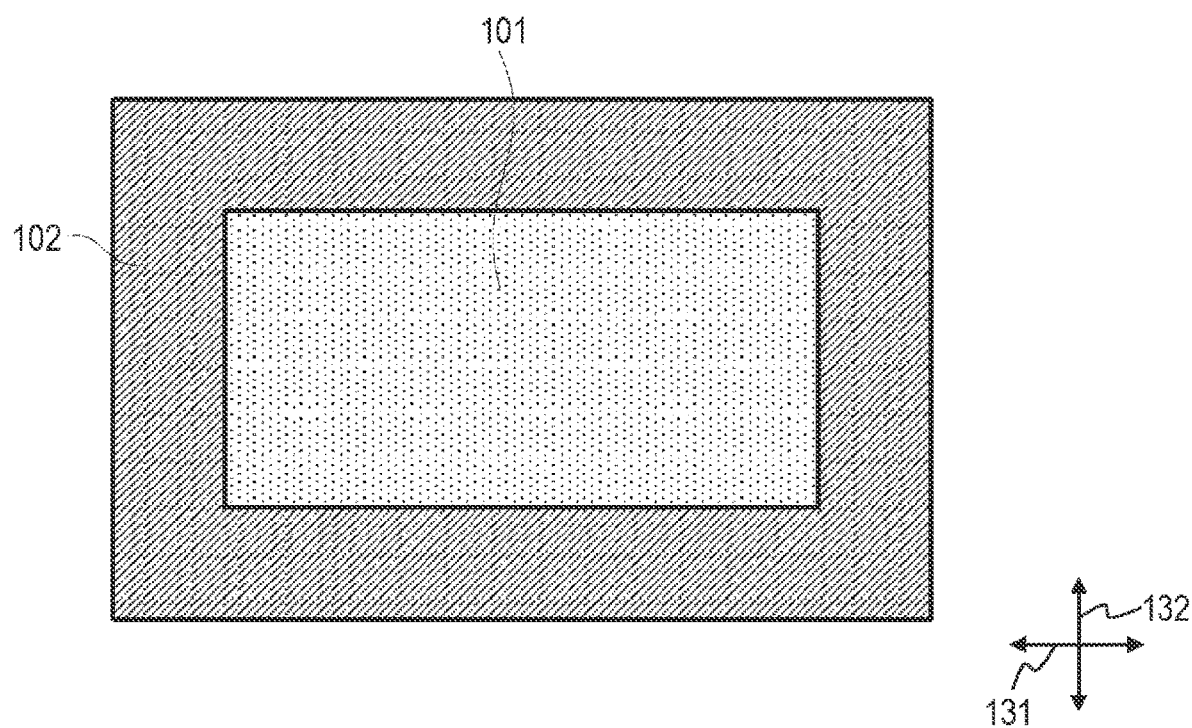
FIG. 5B is a plan view illustrating the pixel region and the peripheral region.

According to the embodiment, the peripheral region 102 is adjacent to the pixel region 101 in a plan view. The first substrate section 1 and the second substrate section 2 are part of the single semiconductor substrate. FIG. 5A and FIG. 5B are plan views illustrating examples of the pixel region 101 and the peripheral region 102. Referring to FIG. 5A, the peripheral region 102 extends in one direction of a first axis 131 and one direction of a second axis 132 in a plan view when with respect to the pixel region 101. Referring to FIG. 5B, the peripheral region 102 extends in both directions of the first axis 131 and both directions of the second axis 132 in a plan view with respect to the pixel region 101.

Figure 5C:
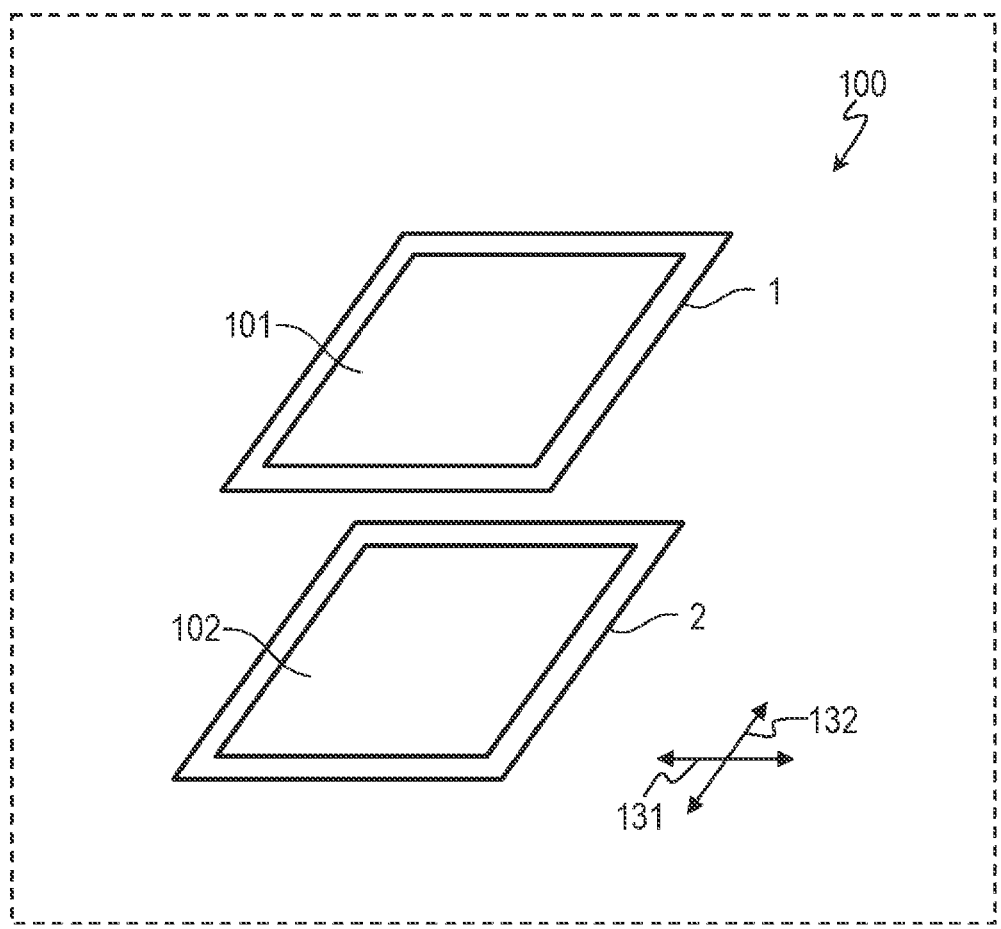
FIG. 5C is an exploded perspective view illustrating the pixel region and the peripheral region.

The peripheral region 102 may at least partially overlap the pixel region 101 in a plan view. FIG. 5C is an exploded perspective view of the pixel region 101 and the peripheral region 102 that at least partially overlap each other. Referring to FIG. 5C, the first substrate section 1 and the second substrate section 2 are separate semiconductor substrates that are mutually laminated. The imaging apparatus 100 in FIG. 5C may be a chip-stack imaging apparatus.

The first axis 131 and the second axis 132 are mutually different axes. The first axis 131 and the second axis 132 may be perpendicular to each other.

According to the embodiment, the pixels 10 form a pixel array PA. The first axis 131 is in parallel with the rows (the columns) of the pixel array PA. The second axis 132 is in parallel with the columns (the rows) of the pixel array PA. Specifically, the first axis 131 is in parallel with each row of the pixel array PA. The second axis 132 is in parallel with each column of the pixel array PA. Alternatively, the first axis 131 may be in parallel with each column of the pixel array PA, and the second axis 132 may be in parallel with each row of the pixel array PA.

The expression that the first penetrating electrode 81 is disposed within the first through-hole 82 is further described herein. The expression includes an arrangement that the first penetrating electrode 81 extends within the first through-hole 82 without protruding from within the first through-hole 82. The expression also includes an arrangement that the first penetrating electrode 81 extends along the first through-hole 82, protruding the first through-hole 82. The same is true of the expression that the second penetrating electrode 83 is disposed within the second through-hole 87.

According to the embodiment, the charge accumulation region FD is the first diffusion region 67n. The charge accumulation region FD is one of the source and the drain of the reset transistor 26. The reset transistor 26 may reset the potential of the charge accumulation region FD.

According to the embodiment, the imaging apparatus 100 includes the shield electrode 16. The shield electrode 16 is electrically isolated from the first electrode. The photoelectric conversion layer 14 is interposed between the shield electrode 16 and the second electrode.

According to the embodiment, an electrical path including the second penetrating electrode 83 electrically isolated from the first penetrating electrode 81 is formed. The electrical path bypasses the first substrate section 1, reaching a specific portion of the pixel region 101. The electrical path does not pass through the first substrate section 1.

The specific portion belongs to the pixel region 101. The use of the electrical patch passing through the first substrate section 1 and reaching the specific portion may be contemplated. However, such an arrangement may possibly cause cross-talk between the electrical path and the first penetrating electrode 81, leading to superimposing noise onto charges flowing through the first penetrating electrode 81. If the electrical path runs to the specific portion bypassing the first substrate section 1, the cross-talk between the electrical path and the first penetrating electrode 81 may be more easily controlled than when the electrical path runs to the specific portion running through the first substrate section 1.

The specific portion may be at any location within the pixel region 101. For example, the shield electrode 16 may include the specific portion. In a different example, the second electrode may include the specific portion. The specific portion is denoted by symbol SP in FIGS. 3, FIG. 4A, and FIG. 4C.

Figure 6:
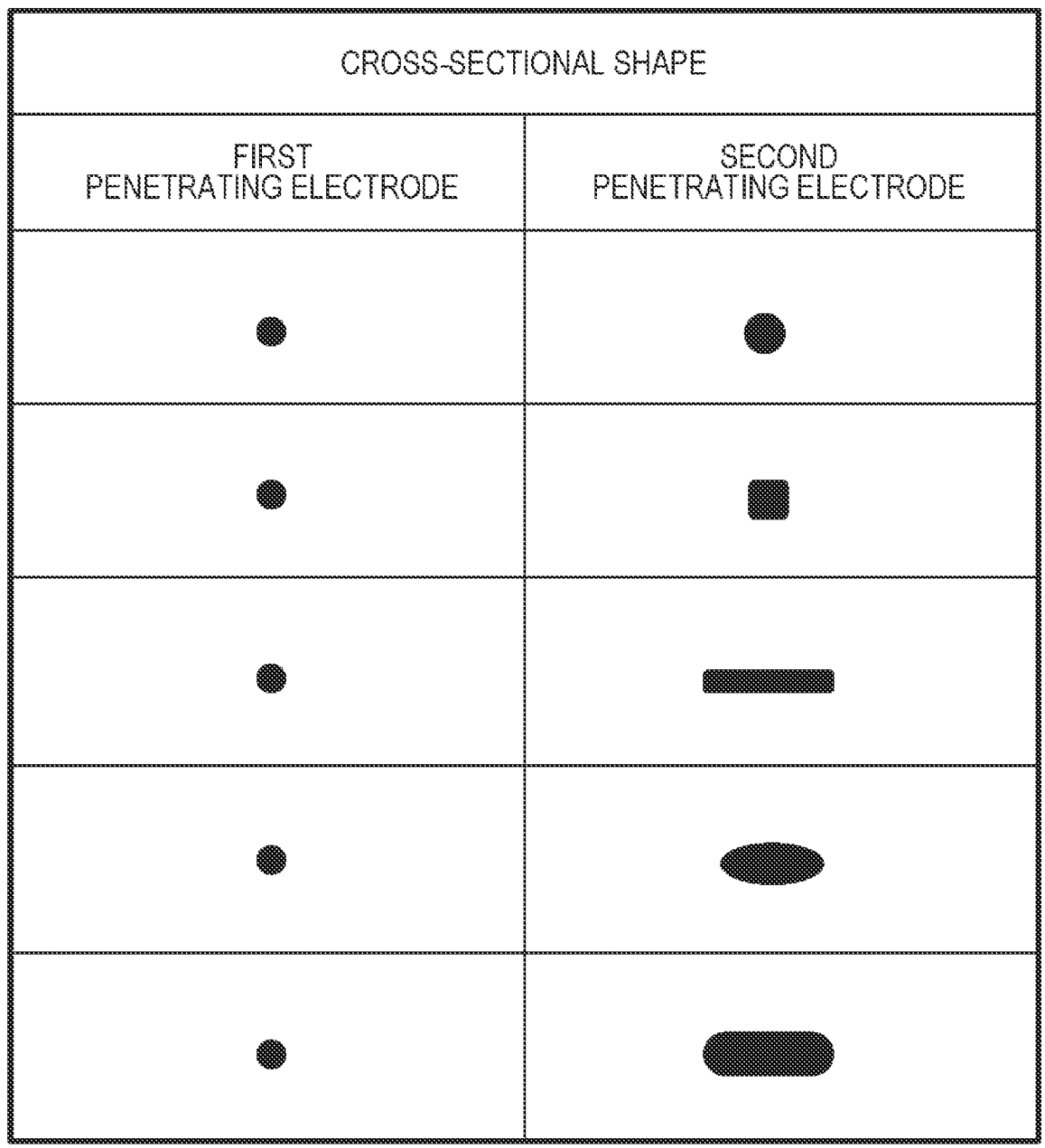
FIG. 6 is a table illustrating cross-sectional shapes of a first penetrating electrode and a second penetrating electrode.

The first penetrating electrode 81 and the second penetrating electrode 83 are not limited to any particular shape. The cross-sectional shape of the first penetrating electrode 81 and the second penetrating electrode 83 may be circular, elliptical, polygonal, rounded-polygonal, or the like. FIG. 6 is a table listing the cross-sectional shapes of the first penetrating electrode 81 and the second penetrating electrode 83.

According to the embodiment, the cross-sectional shape of the first penetrating electrode 81 is different from the cross-sectional shape of the second penetrating electrode 83. The difference between the cross-sectional shape of the first penetrating electrode 81 and the cross-sectional shape of the second penetrating electrode 83 may lead to implementing the requested specifications of the pixel region 101 and the peripheral region 102.

According to the embodiment, the cross-sectional shape of the first penetrating electrode 81 is a shape of the first penetrating electrode 81 in a cross section that is perpendicular to the direction of the thickness of the first substrate section 1 and crosses the first penetrating electrode 81. The cross-sectional shape of the second penetrating electrode 83 is a shape of the second penetrating electrode 83 in a cross section that is perpendicular to the direction of the thickness of the second substrate section 2 and crosses the second penetrating electrode 83. The phrase "the difference between the cross-sectional shapes" signifies that the drawings quoted are neither congruent nor similar to each other.

As an example, the cross-sectional shape of the first penetrating electrode 81 may be closer to a circle than the cross-sectional shape of the second penetrating electrode 83. The cross-sectional shape of the second penetrating electrode 83 is closer to a rectangle than the first penetrating electrode 81. These configurations may lead to beneficially controlling the superimposition of noise on charges flowing through the first penetrating electrode 81 in the pixel region 101 while beneficially permitting a higher current to flow between an element on the first surface and an element on the second surface of the second substrate section 2 in the peripheral region 102. This point of view is described below in greater detail.

In the pixel region 101, charges generated through the photoelectric conversion of the photoelectric conversion layer 14 flow through the first penetrating electrode 81 as a signal. Specifically, since the cross-sectional shape of the first penetrating electrode 81 is rounder, the first penetrating electrode 81 has a relatively smaller cross-sectional area. The first penetrating electrode 81 may less likely generate cross-talk with an electrical path such as other penetrating electrodes and wiring lines. This may beneficially control the superimposition of the noise onto the charges flowing through the first penetrating electrode 81.

The first penetrating electrode 81 having a relatively smaller cross-sectional area may be beneficial in view of implementing a miniaturized pixel region 101. This may also make available space for elements, such as photodiodes, in the first substrate section 1.

The cross-sectional shape of the second penetrating electrode 83 is relatively closer to a rectangle. This may lead to beneficially implementing a second penetrating electrode 83 having a larger cross-sectional area and a lower resistance. The second penetrating electrode 83 having a lower resistance may tend to permit a higher current to flow between the element on the first surface and the element on the second surface of the second substrate section 2. Permitting the higher current to flow may serve to permit elements to operate reliably at a relatively higher speed.

Laser beam may be used in a step of forming a through-hole in a substrate. A through-hole having a rectangular cross section of a smaller or larger size in design may now be formed. If the through-hole having a smaller size is formed, the cross-sectional shape of a through-hole actually formed may tend to be closer to a circle than designed. On the other hand, if the through-hole having a larger size is formed, the cross-sectional shape of a through-hole actually formed may be appropriately sized as designed and may thus tend to be closer to a rectangle. In view of this tendency, if the first penetrating electrode 81 and the second penetrating electrode 83 are designed to be equal in cross-sectional shape but different in size, a difference may result in terms of the actual cross-sectional shape between the produced first penetrating electrode 81 and second penetrating electrode 83 result and such a difference may be acceptable.

Figure 7A:
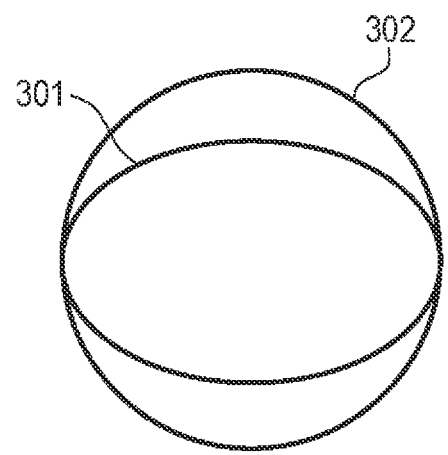
FIG. 7A illustrates how a drawing is closer to a rectangle.

The expression that a drawing is closer to a circle is described below. FIG. 7A illustrates this expression. A drawing 301 closer to a circle signifies that a ratio of an area $S_{301}$ of the drawing 301 to an area $S_{302}$ of a minimum circle 302 surrounding the drawing 301, namely, the ratio $S_{301}/S_{302}$, is larger.

Figure 7B:
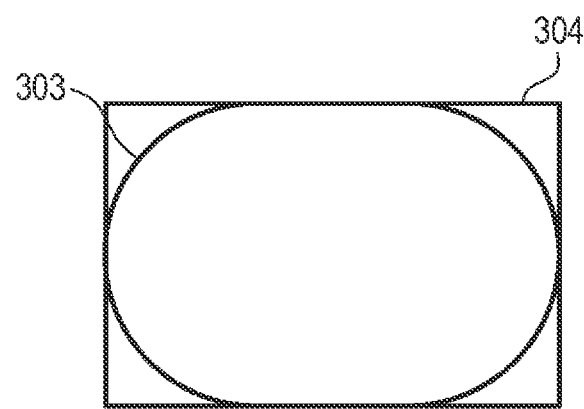
FIG. 7B illustrates how a drawing is closer to a circle.

The expression that a drawing is closer to a rectangle is described below. FIG. 7B illustrates this expression. A drawing 303 closer to a rectangle signifies that a ratio of an area $S_{303}$ of the drawing 303 to an area $S_{304}$ of a minimum rectangle 304 surrounding the drawing 303, namely, the ratio $S_{303}/S_{304}$, is larger.

Figure 8A:
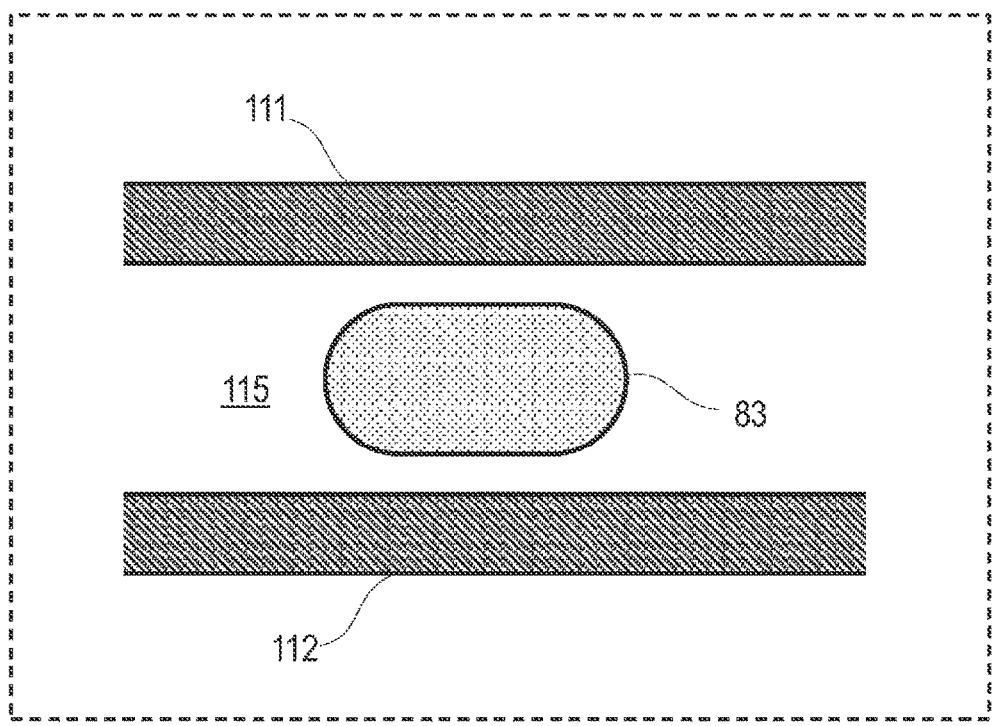
FIG. 8A illustrates the peripheral region including the second penetrating electrode disposed in a gap between wiring lines.
Figure 8B:
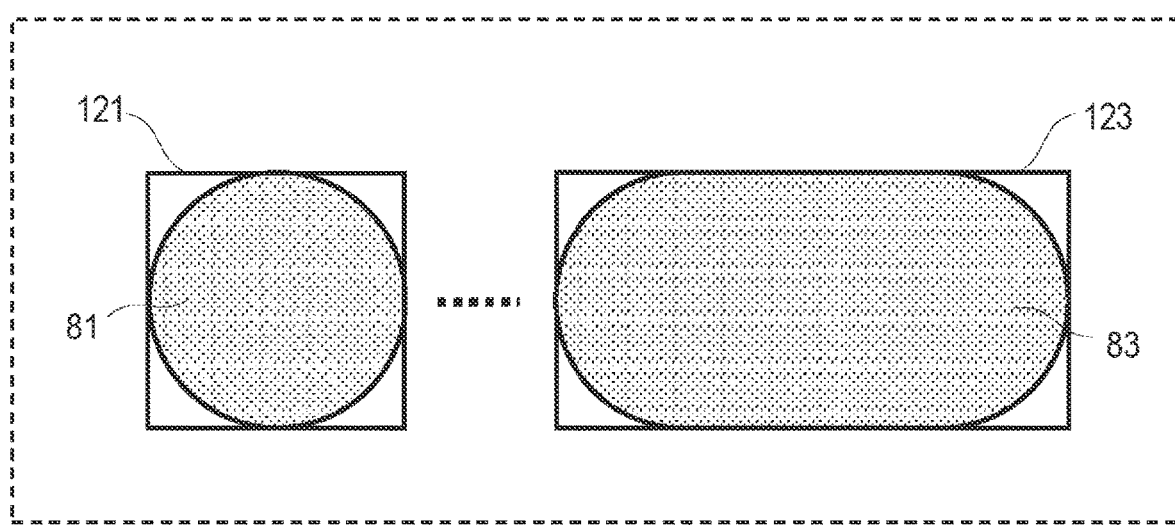
FIG. 8B illustrates the shape of the penetrating electrode.

Multiple wiring lines are typically disposed around the peripheral region 102. FIG. 8A illustrates the peripheral region 102 with the second penetrating electrode 83 disposed in a gap between the wiring lines. FIG. 8B illustrates the shape of the penetrating electrode.

Referring to FIG. 8A and FIG. 8B, the peripheral region 102 includes wiring lines 111 and 112 within the second substrate section 2. The second penetrating electrode 83 runs in a gap 115 between the wiring lines 111 and 112 in a plan view. FIG. 8B illustrates a rectangle 121 having a minimum area surrounding the cross-sectional shape of the first penetrating electrode 81. FIG. 8B illustrates a rectangle 123 having a minimum area surrounding the cross-sectional shape of the second penetrating electrode 83. A rectangle may have a first side and a second side longer than the first side. A ratio of the length of the second side to the length of the first side of the rectangle 121 is defined as a first ratio. A ratio of the length of the second side to the length of the first side of the rectangle 123 is defined as a second ratio. In this case, the first ratio is lower than the second ratio. This may beneficially control the superimposition of the noise onto the charges flowing the first penetrating electrode 81 in the pixel region 101 while also beneficially permitting a higher current to flow between an element on the first surface and an element on the second surface of the second substrate section 2 in the peripheral region 102. This point of view is specifically described below.

In the pixel region 101, the charges generated through the photoelectric conversion of the photoelectric conversion layer 14 may flow through the first penetrating electrode 81 as a signal. Referring to FIG. 8A and FIG. 8B, the first ratio of the first penetrating electrode 81 is relatively lower. The first penetrating electrode 81 having a smaller cross-sectional area may be more easily implemented. This may lead to beneficially controlling the superimposition of the noise onto the charges flowing through the first penetrating electrode 81.

In the peripheral region 102, on the other hand, the wiring lines 111 and 112 are disposed as illustrated in FIG. 8A and FIG. 8B. The second penetrating electrode 83 may be subject to the limitation that the second penetrating electrode 83 is to run through the gap 115 between the wiring lines 111 and 112. With reference to FIG. 8A and FIG. 8B, the second ratio of the second penetrating electrode 83 is relatively higher. This may lead to meeting the limitation while beneficially implementing the second penetrating electrode 83 having a larger cross-sectional area and a lower resistance. The second penetrating electrode 83 having a lower resistance may permit a relatively higher current to more easily flow between the element on the first surface and the element on the second surface of the second substrate section 2.

In the context of the specification, the first side may be the shorter side of a rectangle. The first side may be the side of a square. The second side may be the longer side of the rectangle. The second side may be the side of the square. The wiring lines 111 and 112 may be signal lines.

The cross-sectional shape of the first penetrating electrode 81 may be identical to the cross-sectional shape of the second penetrating electrode 83. The identical shape signifies that the drawings quoted are congruent or similar to each other. The cross-sectional shape of the second penetrating electrode 83 may be closer to a rectangle than the cross-sectional shape of the first penetrating electrode 81. The cross-sectional shape of the first penetrating electrode 81 may be closer to a circle than the cross-sectional shape of the second penetrating electrode 83. A minimum rectangle surrounding the cross-sectional shape of the first penetrating electrode 81 may have a lower ratio of the second side to the first side than a minimum rectangle surrounding the cross-sectional shape of the second penetrating electrode 83.

According to the embodiment, the cross-sectional area of the first penetrating electrode 81 is different from the cross-sectional area of the second penetrating electrode 83. The difference in the cross-sectional area between the first penetrating electrode 81 and the second penetrating electrode 83 may lead to implementing the requested specifications of the pixel region 101 and the peripheral region 102.

According to the embodiment, the cross-sectional area of the first penetrating electrode 81 is defined by a cross section that is perpendicular to the direction of the thickness of the first substrate section 1 and crosses the first penetrating electrode 81. The cross-sectional area of the second penetrating electrode 83 is defined by a cross section that is perpendicular to the direction of the thickness of the second substrate section 2 and crosses the second penetrating electrode 83.

According to the embodiment, the cross-sectional area of the first penetrating electrode 81 is smaller than the cross-sectional area of the second penetrating electrode 83. This may lead to beneficially controlling the superimposition of the noise onto the charges flowing through the first penetrating electrode 81 in the pixel region 101 while also beneficially permitting a higher current to flow between the element on the first surface and the element on the second surface of the second substrate section 2 in the peripheral region 102.

The cross-sectional area of the first penetrating electrode 81 may be larger than the cross-sectional area of the second penetrating electrode 83. The cross-sectional area of the first penetrating electrode 81 may be equal to the cross-sectional area of the second penetrating electrode 83.

Laser beam may be used in a step of forming a through-hole in the substrate. Multiple through-holes of the same cross-sectional area in design may be more densely or more sparsely formed. When the through-holes are more sparsely formed, the laser beam may more likely to converge in an area where one through-hole is to be formed than when the through-holes are more densely formed. With the same cross-sectional area intended in design, the through-holes more sparsely formed are more likely to have a larger cross-sectional area than the through-holes more densely formed. For this reason, the penetrating electrodes more sparsely formed tend to have a larger cross-sectional area than the penetrating electrodes more densely formed. In view of this tendency, equalizing the first penetrating electrode 81 and the second penetrating electrode 83 in terms of designed cross-sectional area may still make a difference in cross-sectional area between actually produced first penetrating electrode 81 and second penetrating electrode 83.

According to the embodiment, an outline length of the cross section of the first penetrating electrode 81 is different from an outline length of the cross section of the second penetrating electrode 83. The difference between the outline lengths of the first penetrating electrode 81 and the second penetrating electrode 83 may lead to implementing the requested specifications of the pixel region 101 and the peripheral region 102.

According to the embodiment, the outline length of the cross section of the first penetrating electrode 81 indicates an outline length of a cross section that is perpendicular to the direction of the thickness of the first substrate section 1 and crosses the first penetrating electrode 81. The outline length of the cross section of the second penetrating electrode 83 indicates an outline length of a cross section that is perpendicular to the direction of the thickness of the second substrate section 2 and crosses the second penetrating electrode 83. The outline length of a drawing refers to a length of an outer edge of the drawing.

According to the embodiment, the outline length of the cross section of the first penetrating electrode 81 is shorter than the outline length of the cross section of the second penetrating electrode 83. This may lead to beneficially controlling the superimposition of the noise onto the charges flowing through the first penetrating electrode 81 in the pixel region 101 while also beneficially permitting the higher current to flow between the element on the first surface and the element on the second surface of the second substrate section 2 in the peripheral region 102. This point of view is specifically described below.

If the outline length of the cross section of the first penetrating electrode 81 is shorter, the first penetrating electrode 81 having a smaller cross-sectional area may be more easily implemented. As described above, this may lead to beneficially controlling the superimposition of the noise onto the charges flowing through the first penetrating electrode 81.

If the outline length of the cross section of the second penetrating electrode 83 is longer, the second penetrating electrode 83 having a larger cross-sectional area may be more easily implemented. As described above, this may leads to beneficially permitting the higher current to flow between the element on the first surface and the element on the second surface of the second substrate section 2.

The outline length of the cross section of the first penetrating electrode 81 may be longer than the outline length of the cross section of the second penetrating electrode 83. The outline length of the cross section of the first penetrating electrode 81 may be equal to the outline length of the cross section of the second penetrating electrode 83.

Depending on the manufacturing method of the penetrating electrode, the cross-sectional area of one end of a penetrating electrode may not strictly be equal to the cross-sectional area of the other end of the penetrating electrode in the direction of the thickness of the substrate. A ratio of the cross-sectional area of the one end of the first penetrating electrode 81 to the cross-sectional area of the other end of the first penetrating electrode 81 in the direction of the thickness of the first substrate section 1 may be, for example, 0.8 or higher and 1.2 or lower, or 0.9 or higher and 1.1 or lower. A ratio of the cross-sectional area of the one end of the second penetrating electrode 83 to the cross-sectional area of the other end of the second penetrating electrode 83 in the direction of the thickness of the second substrate section 2 may be, for example, 0.8 or higher and 1.2 or lower, or 0.9 or higher and 1.1 or lower.

The length of the first penetrating electrode 81 in the direction of the thickness of the first substrate section 1 may be longer than the length of the first through-hole 82 in the direction of the thickness of the first substrate section 1. Alternatively, these lengths may be equal to each other.

The length of the second penetrating electrode 83 in the direction of the thickness of the second substrate section 2 may be longer than the length of the second through-hole 87 in the direction of the thickness of the second substrate section 2. Alternatively, these lengths may be equal to each other.

According to the embodiment, the pixel region 101 includes multiple first electrodes. The pixel region 101 includes multiple first penetrating electrodes 81. The peripheral region 102 includes multiple second penetrating electrodes 83.

The number of first electrodes may be one in the pixel region 101. The number of first penetrating electrodes 81 may be one. The number of second penetrating electrodes 83 may be one in the peripheral region 102.

According to the embodiment, the number density of the first penetrating electrodes 81 is different from the number density of the second penetrating electrodes 83. The difference between the number density of the first penetrating electrodes 81 and the number density of the second penetrating electrodes 83 may lead to implementing the requested specifications of the pixel region 101 and the peripheral region 102.

The number density of the first penetrating electrodes 81 and the number density of the second penetrating electrodes 83 are described below. FIG. 9 illustrates the number density. As described above, the first electrode corresponds to the pixel electrode 13. The first electrode is designated with reference numeral 13. The same is true of the explanation with reference to FIG. 11A and FIG. 11B. A minimum first rectangle 401 surrounding all the first electrodes 13 present in the pixel region 101 in a plan view may now be contemplated. The first rectangle 401 corresponds to the pixel region 101. A minimum second rectangle 402 surrounding all the first electrodes 13 present in the pixel region 101 in a plan view and all the second penetrating electrodes 83 present within the peripheral region 102 may now be contemplated. A first area $S_{401}$ is defined as the area of the first rectangle 401 and a second area $S_{402}$ is defined as a value that results from subtracting the first area $S_{401}$ from the area of the second rectangle 402. The number density of the second penetrating electrodes 83 is calculated by dividing the number of first penetrating electrodes 81 by the first area $S_{401}$. The number density of second penetrating electrodes 83 is calculated by dividing the number of second penetrating electrodes 83 by the second area $S_{402}$. Referring to FIG. 9, symbols "x" schematically illustrate the first penetrating electrodes 81 and the second penetrating electrodes 83.

According to the embodiment, the number density of first penetrating electrodes 81 is smaller than the number density of second penetrating electrode 83. This may lead to beneficially controlling the superimposition of the noise onto the charges flowing through the first penetrating electrode 81 in the pixel region 101 while also beneficially permitting the higher current to flow between the element on the first surface and the element on the second surface of the second substrate section 2 in the peripheral region 102. This point of view is specifically described below.

A smaller number of first penetrating electrodes 81 may cause cross-talk to occur less likely between the first penetrating electrodes 81. This may lead to beneficially controlling the superimposition of the noise onto the charges flowing through the first penetrating electrode 81.

The smaller number of first penetrating electrodes 81 may lead to beneficially implementing a miniaturized pixel region 101. The smaller number of first penetrating electrodes 81 may lead to beneficially ensuring space that accommodates elements, such as a photodiode, in the first substrate section 1.

On the other hand, a larger number density of second penetrating electrodes 83 may permit overall resistance of the second penetrating electrodes 83 to be more easily reduced. This may permit a higher current to beneficially flow between the element on the first surface and the element on the second surface of the second substrate section 2.

The number density of first penetrating electrodes 81 may be larger than the number density of second penetrating electrodes 83. The number density of first penetrating electrodes 81 may be equal to the number density of second penetrating electrodes 83.

According to the embodiment, the areal density of first penetrating electrodes 81 is different from the areal density of second penetrating electrode 83. The difference between the areal density of first penetrating electrodes 81 and the areal density of second penetrating electrode 83 may lead to implementing the request specifications of the pixel region 101 and the peripheral region 102.

The areal density of first penetrating electrodes 81 and the areal density of second penetrating electrode 83 may be described in accordance with the area $S_{401}$ and the second area $S_{402}$ described with reference to FIG. 9. The areal density of first penetrating electrodes 81 is calculated by dividing by the area $S_{401}$ a sum of cross-sectional areas of the first penetrating electrodes 81 in a cross section that is in perpendicular to the direction of the thickness of the first substrate section 1. The areal density of second penetrating electrode 83 is calculated by dividing by the second area $S_{402}$ a sum of cross-sectional areas of the second penetrating electrodes 83 in a cross section that is perpendicular to the direction of the thickness of the second substrate section 2.

According to the embodiment, the areal density of first penetrating electrodes 81 is smaller than the areal density of second penetrating electrode 83. This may lead to beneficially controlling the superimposition of the noise onto the charges flowing through the first penetrating electrode 81 in the pixel region 101 while also beneficially permitting the higher current to flow between the element on the first surface and the element on the second surface of the second substrate section 2 in the peripheral region 102. This point of view is specifically described below.

A smaller areal density of first penetrating electrodes 81 may more easily implement the first penetrating electrodes 81 that are less likely to cause cross-talk with an electrical path, such as other penetrating electrodes and wiring lines. This may lead to beneficially controlling the superimposition of the noise onto the charges flowing through the first penetrating electrode 81.

The smaller areal density of first penetrating electrodes 81 may lead to beneficially implementing a miniaturized pixel region 101. This may lead to beneficially ensuring space that accommodates elements, such as a photodiode, in the first substrate section 1.

On the other hand, a larger areal density of second penetrating electrodes 83 may permit overall resistance of the second penetrating electrodes 83 to be more easily reduced. This may permit the higher current to beneficially flow between the element on the first surface and the element on the second surface of the second substrate section 2.

The areal density of first penetrating electrodes 81 may be larger than the areal density of second penetrating electrodes 83. The areal density of first penetrating electrodes 81 may be equal to the areal density of second penetrating electrodes 83.

According to the embodiment, a material of the first penetrating electrode 81 is different from a material of the second penetrating electrode 83. The difference between the material of the first penetrating electrodes 81 and the material of the second penetrating electrodes 83 may lead to implementing the requested specifications of the pixel region 101 and the peripheral region 102.

The difference between the materials signifies not only an ingredient difference but also an ingredient content difference.

The principal ingredient of the first penetrating electrode 81 is different from the principal ingredient of the second penetrating electrode 83.

According to the embodiment, the first penetrating electrode 81 does not substantially contain copper. The second penetrating electrode 83 contains copper as a principal gradient. This may lead to beneficially controlling the diffusion of copper in the pixel region 101 while also beneficially permitting the higher current to flow between the element on the first surface and the element on the second surface of the second substrate section 2 in the peripheral region 102. Specifically, this may control in the pixel region 101 a leakage current that is generated in the photoelectric conversion layer 14 when copper diffuses into the photoelectric conversion layer 14. Conductivity of copper implements the second penetrating electrode 83 having a lower resistance in the peripheral region 102. For this reason, this may more easily permit a higher current to flow between the element on the first surface and the element on the second surface of the second substrate section 2.

The first penetrating electrode 81 may contain copper as a principal ingredient. The second penetrating electrode 83 may not substantially contain copper. The first penetrating electrode 81 and the second penetrating electrode 83 may contain the same principal ingredient. The first penetrating electrode 81 and the second penetrating electrode 83 may be manufactured of the same material.

Figure 10A:
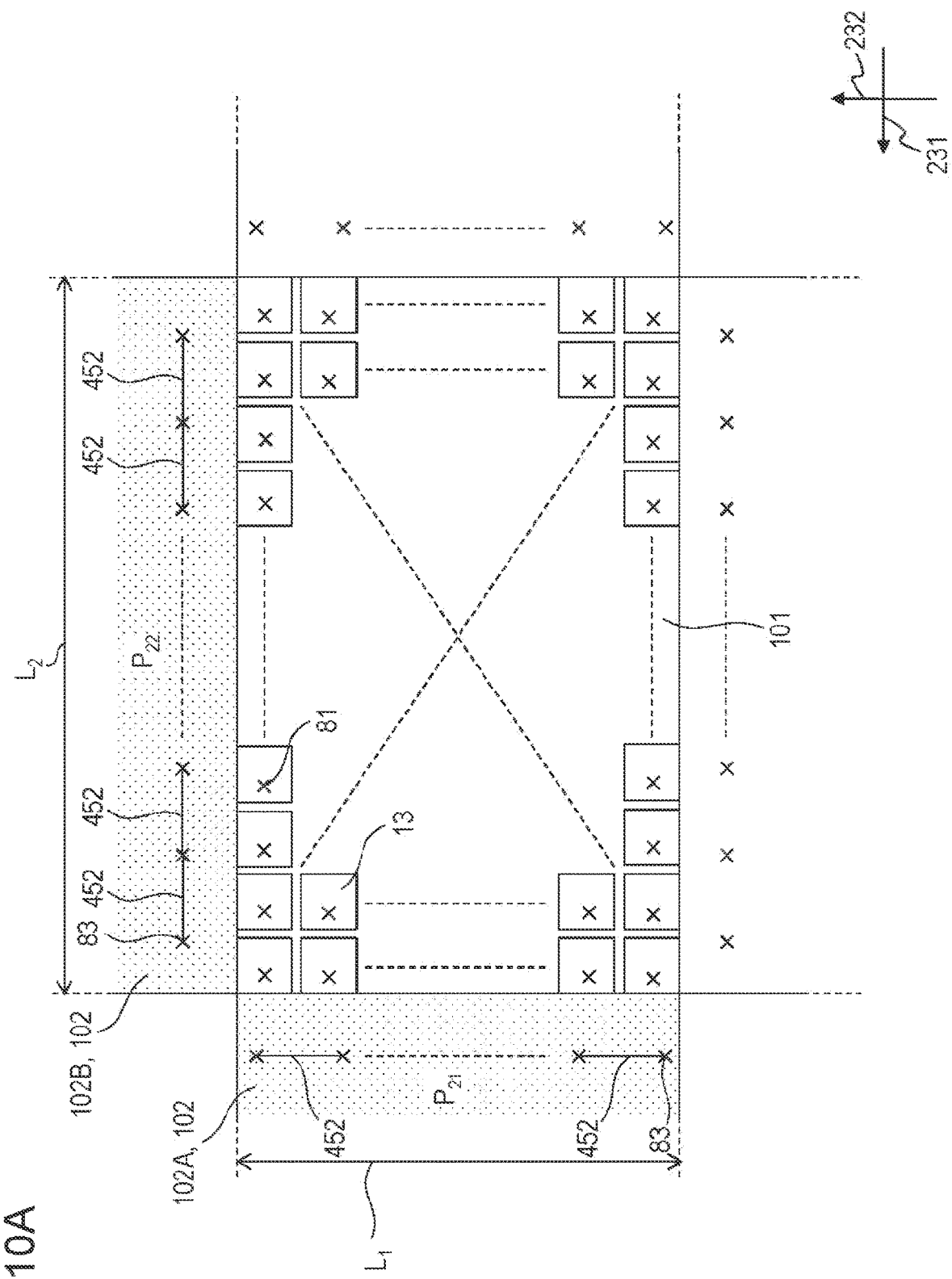
FIG. 10A illustrates an arrangement interval of the second penetrating electrodes.
Figure 10B:
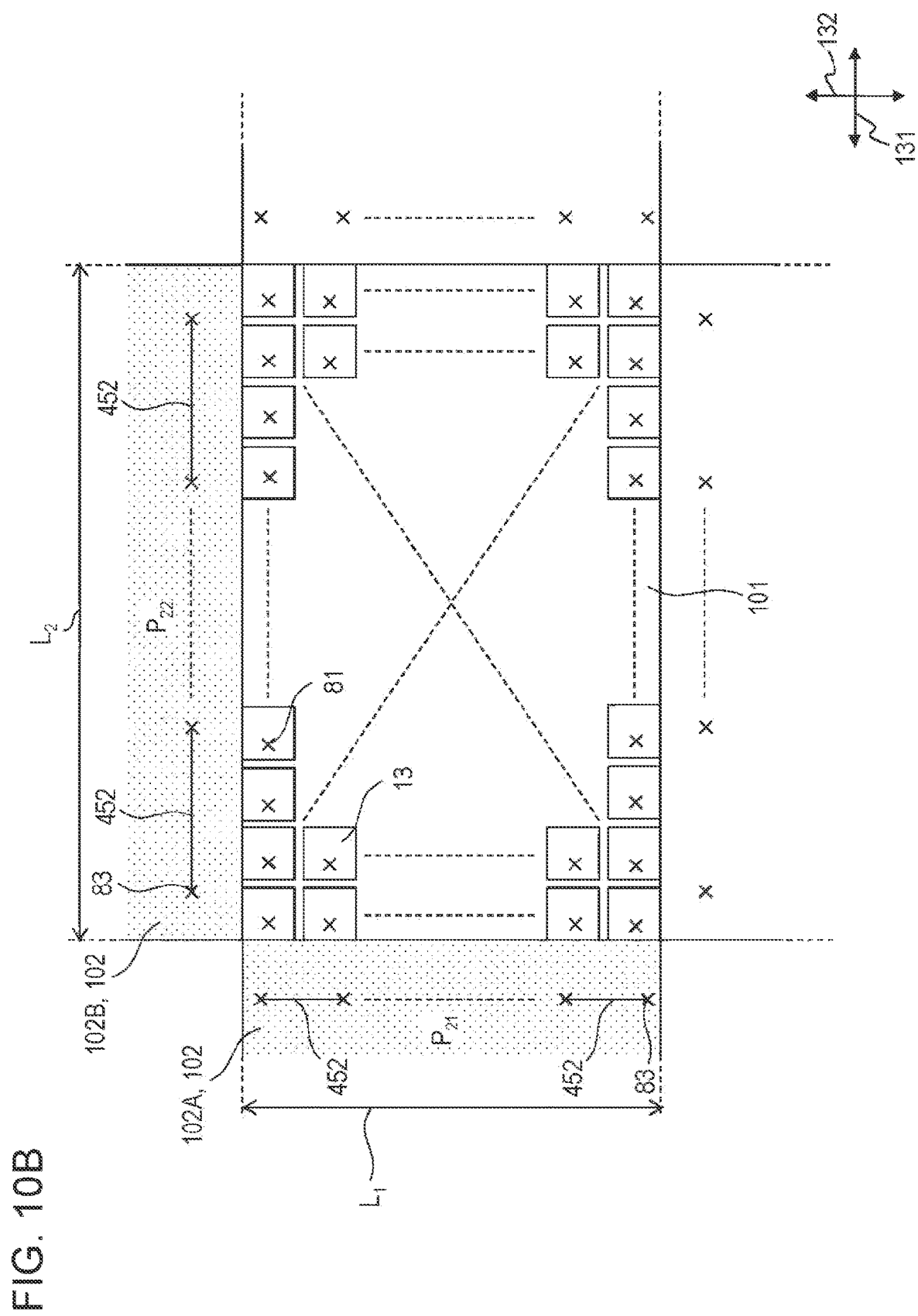
FIG. 10B illustrates the arrangement interval of the second penetrating electrodes.

The arrangement interval of the second penetrating electrodes 83 is described below. FIG. 10A illustrates an example of the arrangement interval of the second penetrating electrodes 83. FIG. 10B illustrates another example of the arrangement interval of the second penetrating electrodes 83.

Referring to FIG. 10A and FIG. 10B, the peripheral region 102 includes a first adjacent region 102A and a second adjacent region 102B. The first peripheral regions 102A are adjacent to the pixel region 101 at sides of the pixel region 101 perpendicular to a first direction 231 in a plan view. The second adjacent region 102B is adjacent to the pixel region 101 at sides of the pixel region 101 perpendicular to a second direction 232 in a plan view. Each of the first adjacent region 102A and the second adjacent region 102B includes multiple second penetrating electrodes 83.

Referring to FIG. 10A and FIG. 10B, the mean value of the arrangement intervals of the second penetrating electrodes 83 in the first adjacent region 102A is denoted by a mean arrangement interval $P_{21}$. The mean value of the arrangement intervals of the second penetrating electrodes 83 in the second adjacent region 102B is denoted by a mean arrangement interval $P_{22}$. The size of the first adjacent region 102A in a second direction 132 is denoted by a size $L_1$. The size of the second adjacent region 102B in a first direction 131 is denoted by a size $L_2$.

Referring to FIG. 10A, a ratio of the mean arrangement interval $P_{21}$ to the mean arrangement interval $P_{22}$, namely, ratio $P_{21}/P_{22}$, is 0.8 or higher and 1.2 or lower. If the two mean arrangement intervals are nearly equal in this way, the current supply capability of the first adjacent region 102A per unit length in the second direction 232 may be easily equalized to the current supply capability of the second adjacent region 102B per unit length in the first direction 231. The ratio $P_{21}/P_{22}$ may be 0.9 or higher and 1.1 or lower.

Referring to FIG. 10B, the size $L_1$ is shorter than the size $L_2$. The mean arrangement interval $P_{21}$ is shorter than the mean arrangement interval $P_{22}$. If the size relationship of the arrangement intervals described above is satisfied with the above-described size relationship of the first adjacent region 102A and the second adjacent region 102B satisfied, the current supply capability of the entire first adjacent region 102A may be more easily equalized to the current supply capability of the entire second adjacent region 102B.

The ratio of the size $L_1$ to the size $L_2$, namely, ratio $L_1/L_2$, is referred to as a standard ratio $L_1/L_2$. The ratio of the mean arrangement interval $P_{21}$ to the mean arrangement interval $P_{22}$, namely, ratio $P_{21}/P_{22}$, is referred to as an arrangement ratio $P_{21}/P_{22}$. The ratio of the arrangement ratio $P_{21}/P_{22}$ to the standard ratio $L_1/L_2$ is 0.8 or higher and 1.2 or lower, or may be 0.9 or higher and 1.1 or lower. The arrangement ratio $P_{21}/P_{22}$ may be equal to the standard ratio $L_1/L_2$.

The mean arrangement interval of the second penetrating electrode 83 may be defined as described below. A line is drawn between geometric centers of adjacent second penetrating electrodes 83 in a plan view. In this way, multiple line segments 452 result. The mean arrangement interval of the second penetrating electrode 83 is the mean value of the lengths of the line segments 452.

According to the embodiment, the second penetrating electrodes 83 include the third penetrating electrode 84 and fourth penetrating electrode 85, which are electrically isolated from each other. In this configuration, the connection destination of the third penetrating electrode 84 and the connection destination of the fourth penetrating electrode 85 are thus electrically isolated from each other.

According to the embodiment, the peripheral region 102 includes multiple third penetrating electrodes 84. The peripheral region 102 also includes multiple fourth penetrating electrodes 85.

According to the embodiment, the third penetrating electrodes 84 are electrically connected to each other. The fourth penetrating electrodes 85 are electrically connected to each other.

Alternatively, the third penetrating electrodes 84 may be electrically isolated from each other. The fourth penetrating electrodes 85 may be electrically isolated from each other.

According to the embodiment, the third penetrating electrode 84 is electrically connected to the shield electrode 16. The third penetrating electrode 84 in this configuration may electrically connect the shield electrode 16 to an element present on a side opposite from the shield electrode 16 when viewed from the second substrate section 2.

According to the embodiment, the fourth penetrating electrode 85 is electrically connected to the second electrode. The fourth penetrating electrode 85 in this configuration may electrically connect the second electrode to an element present on a side opposite from the second electrode when viewed from the second substrate section 2. As described above, the second electrode may correspond to the counter electrode 15.

According to the embodiment, a difference between a maximum value and a minimum value of a control voltage applied to one of the third penetrating electrode 84 and the fourth penetrating electrode 85 is larger than a difference between a maximum value and a minimum value of a control voltage applied to the other of the third penetrating electrode 84 and the fourth penetrating electrode 85. An electrical resistance of one of the third penetrating electrode 84 and the fourth penetrating electrode 85 is lower than an electrical resistance of the other of the third penetrating electrode 84 and the fourth penetrating electrode 85. In this configuration, the electrical resistance of the penetrating electrode having a wider range of voltage swing is relatively lower. This may beneficially control resistance loss.

According to the embodiment, the difference between the maximum value and the minimum value of the control voltage applied to the fourth penetrating electrode 85 is larger than the difference between the maximum value and the minimum value of the control voltage applied to the third penetrating electrode 84. The electrical resistance of the fourth penetrating electrode 85 is lower than the electrical resistance of the third penetrating electrode 84. This configuration may be useful in the imaging apparatus 100 having a global shutter function.

Alternatively, the difference between the maximum value and the minimum value of the control voltage applied to the third penetrating electrode 84 may be larger than the difference between the maximum value and the minimum value of the control voltage applied to the fourth penetrating electrode 85. The electrical resistance of the third penetrating electrode 84 may be lower than the electrical resistance of the fourth penetrating electrode 85.

Alternatively, the difference between the maximum value and the minimum value of the control voltage applied to the third penetrating electrode 84 may be equal to the difference between the maximum value and the minimum value of the control voltage applied to the fourth penetrating electrode 85. The electrical resistance of the third penetrating electrode 84 may be equal to the electrical resistance of the fourth penetrating electrode 85.

The cross-sectional shape of the third penetrating electrode 84 may be different from the cross-sectional shape of the fourth penetrating electrode 85. The difference between the cross-sectional shape of the third penetrating electrode 84 and the cross-sectional shape of the fourth penetrating electrode 85 may lead to implementing the requested specifications of the connection destination of the third penetrating electrode 84 and the connection destination of the fourth penetrating electrode 85.

One of the third penetrating electrode 84 and the fourth penetrating electrode 85 may be closer to a circle than the other of the third penetrating electrode 84 and the fourth penetrating electrode 85. The other of the third penetrating electrode 84 and the fourth penetrating electrode 85 may be closer to a rectangle than the one of the third penetrating electrode 84 and the fourth penetrating electrode 85. The third penetrating electrode 84 and the fourth penetrating electrode 85 may have the same cross-sectional shape.

The cross-sectional shape of the third penetrating electrode 84 may be different from the cross-sectional shape of the fourth penetrating electrode 85. The difference between the cross-sectional shape of the third penetrating electrode 84 and the cross-sectional shape of the fourth penetrating electrode 85 may lead to implementing the requested specifications of the connection destination of the third penetrating electrode 84 and the connection destination of the fourth penetrating electrode 85.

The cross-sectional area of the third penetrating electrode 84 may be smaller than the cross-sectional area of the fourth penetrating electrode 85. The cross-sectional area of the third penetrating electrode 84 may be larger than the cross-sectional area of the fourth penetrating electrode 85. The cross-sectional area of the third penetrating electrode 84 may be equal to the cross-sectional area of the fourth penetrating electrode 85.

The outline length of the cross section of the third penetrating electrode 84 may be different from the outline length of the cross section of the fourth penetrating electrode 85. The difference between the outline length of the cross section of the third penetrating electrode 84 and the outline length of the cross section of the fourth penetrating electrode 85 may lead to implementing the requested specifications of the connection destination of the third penetrating electrode 84 and the connection destination of the fourth penetrating electrode 85.

The outline length of the cross section of the third penetrating electrode 84 may be shorter than the outline length of the cross section of the fourth penetrating electrode 85. The outline length of the cross section of the third penetrating electrode 84 may be longer than the outline length of the cross section of the fourth penetrating electrode 85. The outline length of the cross section of the third penetrating electrode 84 may be equal to the outline length of the cross section of the fourth penetrating electrode 85.

Each of the third penetrating electrode 84 and the fourth penetrating electrode 85 has a circular cross-sectional shape. The diameter of the cross-sectional shape of the third penetrating electrode 84 may be smaller than the diameter of the cross-sectional shape of the fourth penetrating electrode 85. The diameter of the cross-sectional shape of the third penetrating electrode 84 may be larger than the diameter of the cross-sectional shape of the fourth penetrating electrode 85. The diameter of the cross-sectional shape of the third penetrating electrode 84 may be equal to the diameter of the cross-sectional shape of the fourth penetrating electrode 85.

According to the embodiment, the peripheral region 102 includes multiple third penetrating electrodes 84. The peripheral region 102 includes multiple fourth penetrating electrodes 85.

The number of third penetrating electrodes 84 in the peripheral region 102 may be one. The number of fourth penetrating electrodes 85 in the peripheral region 102 may be one.

According to the embodiment, the number density of the third penetrating electrodes 84 may be different from the number density of the fourth penetrating electrodes 85. The difference between the number density of the third penetrating electrode 84 and the number density of the fourth penetrating electrode 85 may lead to implementing the requested specifications of the connection destination of the third penetrating electrode 84 and the connection destination of the fourth penetrating electrode 85.

The number density of the third penetrating electrodes 84 is described below. FIG. 11A illustrates the number density of the third penetrating electrodes 84. The number density of the fourth penetrating electrodes 85 is also described below. FIG. 11B illustrates the number density of the fourth penetrating electrodes 85.

A minimum first rectangle 501 surrounding all the first electrodes 13 present in the pixel region 101 in a plan view is now contemplated with reference to FIG. 11A and FIG. 11B. The first rectangle 501 corresponds to the pixel region 101. The area of the first rectangle 501 is designated with a first area $S_{501}$.

A minimum third rectangle 503 surrounding all the first electrodes 13 present in the pixel region 101 in a plan view and all the third penetrating electrodes 84 present in the peripheral region 102 in a plan view may now be contemplated with reference to FIG. 11A. A third area $S_{503}$ is defined as a value that results from subtracting the first area $S_{501}$ from the area of the third rectangle 503. The number density of the third penetrating electrodes 84 is calculated by dividing the number of third penetrating electrodes 84 by the third area $S_{503}$.

A minimum fourth rectangle 504 surrounding all the first electrodes 13 present in the pixel region 101 in a plan view and all the fourth penetrating electrodes 85 present in the peripheral region 102 in a plan view may now be contemplated with reference to FIG. 11B. A fourth area $S_{504}$ is defined as a value that results from subtracting the first area $S_{501}$ from the area of the fourth rectangle 504. The number density of the fourth penetrating electrodes 85 is calculated by dividing the number of fourth penetrating electrodes 85 by the fourth area $S_{504}$.

The number density of the third penetrating electrodes 84 may be smaller than the number density of the fourth penetrating electrodes 85. The number density of the third penetrating electrodes 84 may be larger than the number density of the fourth penetrating electrodes 85. The number density of the third penetrating electrodes 84 may be equal to the number density of the fourth penetrating electrodes 85.

According to the embodiment, the areal density of the third penetrating electrodes 84 may be different from the areal density of the fourth penetrating electrodes 85. The difference between the areal density of the third penetrating electrodes 84 and the area density of the fourth penetrating electrodes 85 may lead to implementing the requested specifications of the connection destination of the third penetrating electrode 84 and the connection destination of the fourth penetrating electrode 85.

The areal density of the third penetrating electrodes 84 and the area density of the fourth penetrating electrodes 85 are described with reference to the third area $S_{503}$ and the fourth area $S_{504}$ illustrated in FIG. 11A and FIG. 11B. The areal density of the third penetrating electrodes 84 is determined by dividing by the third area $S_{503}$ the sum of cross-sectional areas of the third penetrating electrodes 84 in a cross section perpendicular to the direction of the thickness of the second substrate section 2. The area density of the fourth penetrating electrodes 85 is determined by dividing by the fourth area $S_{504}$ the sum of cross-sectional areas of the fourth penetrating electrode 85 in a cross section perpendicular to the direction of the thickness of the second substrate section 2.

The areal density of the third penetrating electrodes 84 may be smaller than the area density of the fourth penetrating electrodes 85. The areal density of the third penetrating electrodes 84 may be larger than the area density of the fourth penetrating electrodes 85. The areal density of the third penetrating electrodes 84 may be equal to the area density of the fourth penetrating electrodes 85.

Referring to FIG. 11A, the third penetrating electrodes 84 are present on both sides of the pixel region 101 perpendicular to the first axis 131 and on the upper and lower sides of the pixel region 101 perpendicular to the second axis 132. Referring to FIG. 11B, the fourth penetrating electrodes 85 are present on both sides of the pixel region 101 perpendicular to the first axis 131 but are not present on the upper and lower sides of the pixel region 101 perpendicular to the second axis 132.

The third penetrating electrodes 84 may be present on both sides of the pixel region 101 perpendicular to the first axis 131, may be present on one side of the pixel region 101 perpendicular to the first axis 131, or may be present on neither one of the sides of the pixel region 101 perpendicular to the first axis 131. The third penetrating electrodes 84 may be present on the upper and lower sides of the pixel region 101 perpendicular to the second axis 132, may be present on one of the upper and lower sides on the pixel region 101 perpendicular to the second axis 132, or may be present on neither one of the upper and lower sides of the pixel region 101 perpendicular to the second axis 132.

The fourth penetrating electrodes 85 may be present on both sides of the pixel region 101 perpendicular to the first axis 131, may be present on one side of the pixel region 101 perpendicular to the first axis 131, or may be present on neither one of the sides of the pixel region 101 perpendicular to the first axis 131. The fourth penetrating electrodes 85 may be present on the upper and lower sides of the pixel region 101 perpendicular to the second axis 132, may be present on one of the upper and lower sides on the pixel region 101 perpendicular to the second axis 132, or may be present on neither one of the upper and lower sides of the pixel region 101 perpendicular to the second axis 132.

Figure 12A:
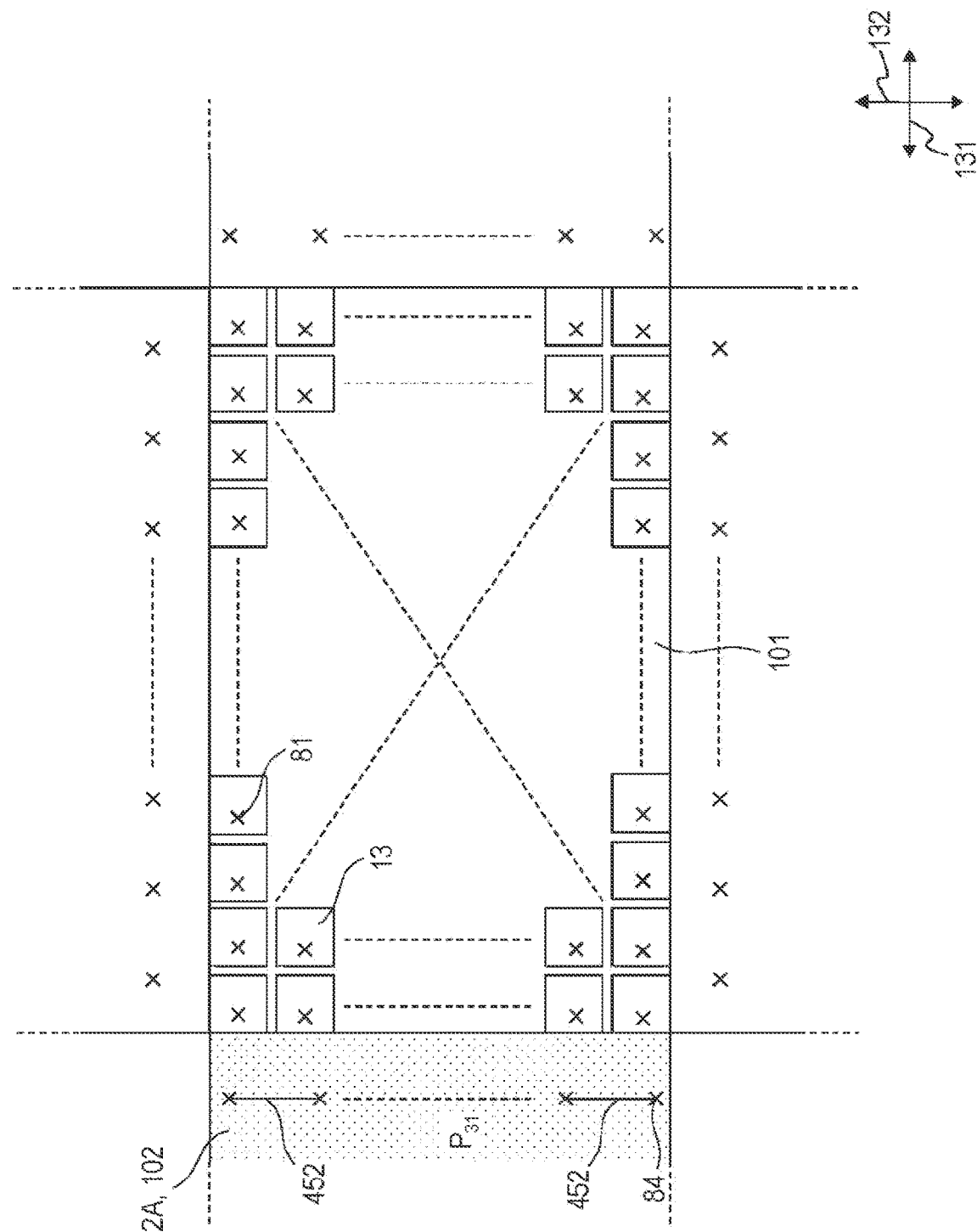
FIG. 12A illustrates an arrangement interval of the third penetrating electrodes.
Figure 12B:
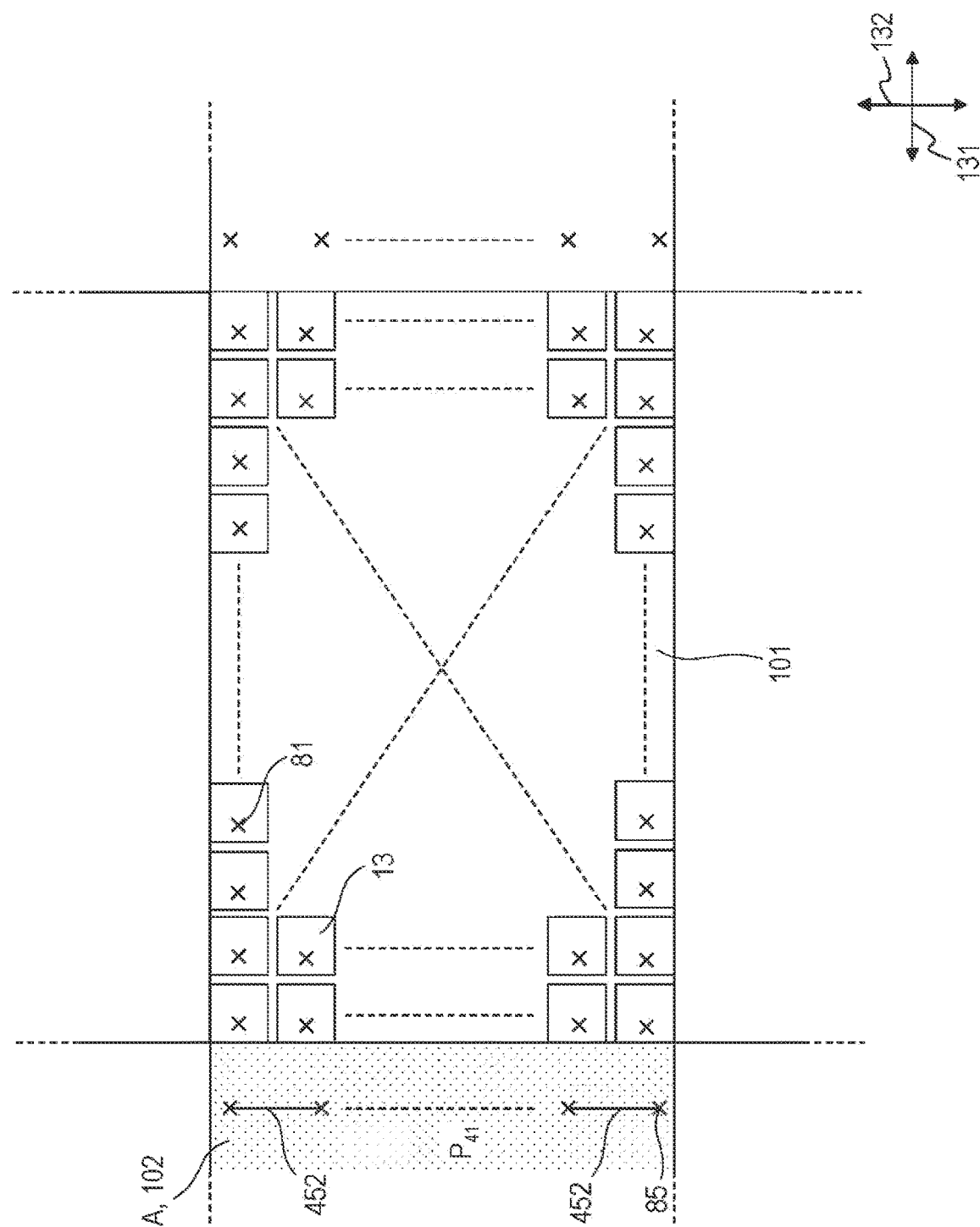
FIG. 12B illustrates an arrangement interval of the fourth penetrating electrodes.

The arrangement intervals of the third penetrating electrode 84 and the fourth penetrating electrode 85 are described below. FIG. 12A illustrates the arrangement interval of the third penetrating electrodes 84. The fourth penetrating electrodes 85 are not illustrated in FIG. 12A. FIG. 12B illustrates the arrangement interval of the fourth penetrating electrodes 85. The third penetrating electrodes 84 are not illustrated in FIG. 12B.

According to the embodiment, as illustrated in FIG. 12A, the first adjacent region 102A includes the multiple third penetrating electrodes 84. Referring to FIG. 12B, the first adjacent region 102A includes the multiple fourth penetrating electrodes 85. The mean value of the arrangement intervals of the third penetrating electrodes 84 in the first adjacent region 102A is denoted by a mean arrangement interval $P_{31}$. The mean value of the arrangement intervals of the fourth penetrating electrodes 85 in the first adjacent region 102A is denoted by a mean arrangement interval $P_{41}$. The mean arrangement interval $P_{31}$ is different from the mean arrangement interval $P_{41}$. The difference between the mean arrangement interval of the third penetrating electrodes 84 and the mean arrangement interval of the fourth penetrating electrodes 85 may lead to implementing the requested specifications of the connection destination of the third penetrating electrode 84 and the connection destination of the fourth penetrating electrode 85.

The mean arrangement interval $P_{31}$ may be equal to the mean arrangement interval $P_{41}$.

The mean arrangement interval $P_{31}$ of the third penetrating electrodes 84 in the first adjacent region 102A is denoted by a third mean arrangement interval $P_{31}$. The mean arrangement interval $P_{41}$ of the fourth penetrating electrodes 85 in the first adjacent region 102A is denoted by a fourth mean arrangement interval $P_{41}$. The ratio of the third mean arrangement interval $P_{31}$ to the fourth mean arrangement interval $P_{41}$ may be lower than 0.8, or 0.8 or higher and 1.2 or lower, or higher than 1.2.

Each of the first adjacent region 102A and the second adjacent region 102B may include multiple third penetrating electrodes 84. Each of the first adjacent region 102A and the second adjacent region 102B may include multiple fourth penetrating electrode 85.

The mean value of the arrangement intervals of the third penetrating electrodes 84 in the first adjacent region 102A is denoted by a mean arrangement interval $P_{31}$. The mean value of the arrangement intervals of the third penetrating electrodes 84 in the second adjacent region 102B is denoted by a mean arrangement interval $P_{32}$. The mean value of the arrangement intervals of the fourth penetrating electrodes 85 in the first adjacent region 102A is denoted by a mean arrangement interval $P_{41}$. The mean value of the arrangement intervals of the fourth penetrating electrodes 85 in the second adjacent region 102B is denoted by a mean arrangement interval $P_{42}$.

The ratio of the mean arrangement interval $P_{31}$ to the mean arrangement interval $P_{32}$, namely, the ratio $P_{31}/P_{32}$, may be 0.8 or higher and 1.2 or lower. Alternatively, the ratio $P_{31}/P_{32}$ may be 0.9 or higher and 1.1 or lower.

The size $L_1$ of the first adjacent region 102A in the second axis 132 may be shorter than the size $L_2$ of the second adjacent region 102B in the first axis 131. The mean arrangement interval $P_{31}$ may be shorter than the mean arrangement interval $P_{32}$.

The ratio of the mean arrangement interval $P_{31}$ to the mean arrangement interval $P_{32}$ is denoted by an arrangement ratio $P_{31}/P_{32}$. The ratio of the arrangement ratio $P_{31}/P_{32}$ to the standard ratio $L_1/L_2$ is, for example, 0.8 or higher and 1.2 or lower, or may be 0.9 or higher and 1.1 or lower. The arrangement ratio $P_{31}/P_{32}$ may be equal to the standard ratio $L_1/L_2$.

The ratio of the mean arrangement interval $P_{41}$ to the mean arrangement interval $P_{42}$, namely, the ratio $P_{41}/P_{42}$, may be 0.8 or higher and 1.2 or lower. The ratio $P_{41}/P_{42}$ may be 0.9 or higher and 1.1 or lower.

The size $L_1$ of the first adjacent region 102A in the second axis 132 may be shorter than the size $L_2$ of the second adjacent region 102B in the first axis 131. The mean arrangement interval $P_{41}$ may be shorter than the mean arrangement interval $P_{42}$.

The ratio of the mean arrangement interval $P_{41}$ to the mean arrangement interval $P_{42}$ is denoted by an arrangement ratio $P_{41}/P_{42}$. The ratio of the arrangement ratio $P_{41}/P_{42}$ to the standard ratio $L_1/L_2$ is, for example, 0.8 or higher and 1.2 or lower, or may be 0.9 or higher and 1.1 or lower. The arrangement ratio $P_{41}/P_{42}$ may be equal to the standard ratio $L_1/L_2$.

FIG. 13A through FIG. 13E illustrate specific examples of the arrangements of the penetrating electrodes. Referring to FIG. 13A through FIG. 13E, fill portions in the pixel region 101 denote the first penetrating electrodes 81. The first penetrating electrodes 81 are illustrated only in part of the pixel region 101 in FIG. 13A through FIG. 13E. In practice, however, the first penetrating electrodes 81 may be uniformly disposed over the entire pixel region 101 in a plan view. Fill portions outside the pixel region 101 schematically illustrate the second penetrating electrodes 83 in the peripheral region 102.

Figure 13A:
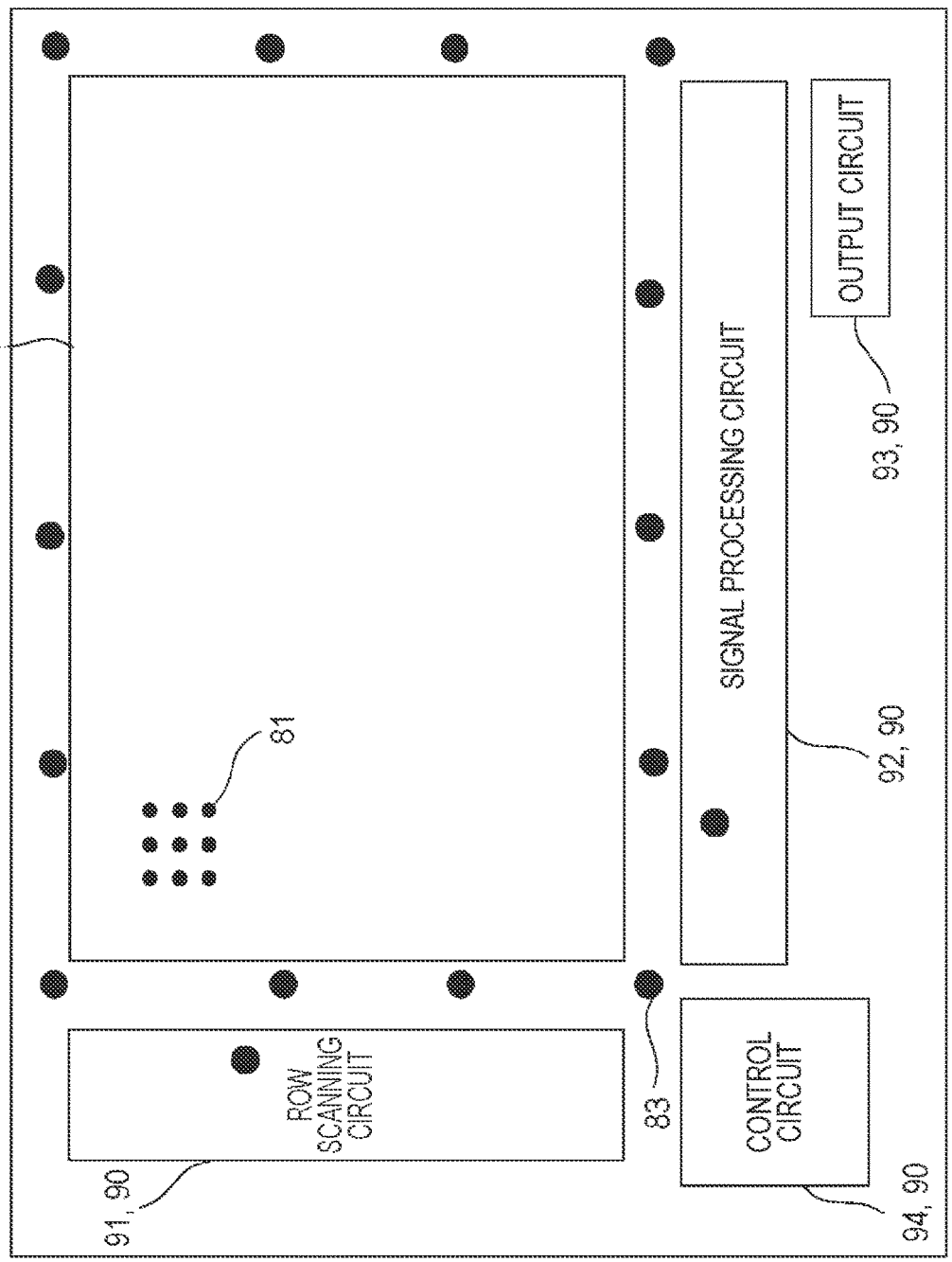
FIG. 13A illustrates a specific example of the arrangement of the penetrating electrodes.
Figure 13B:
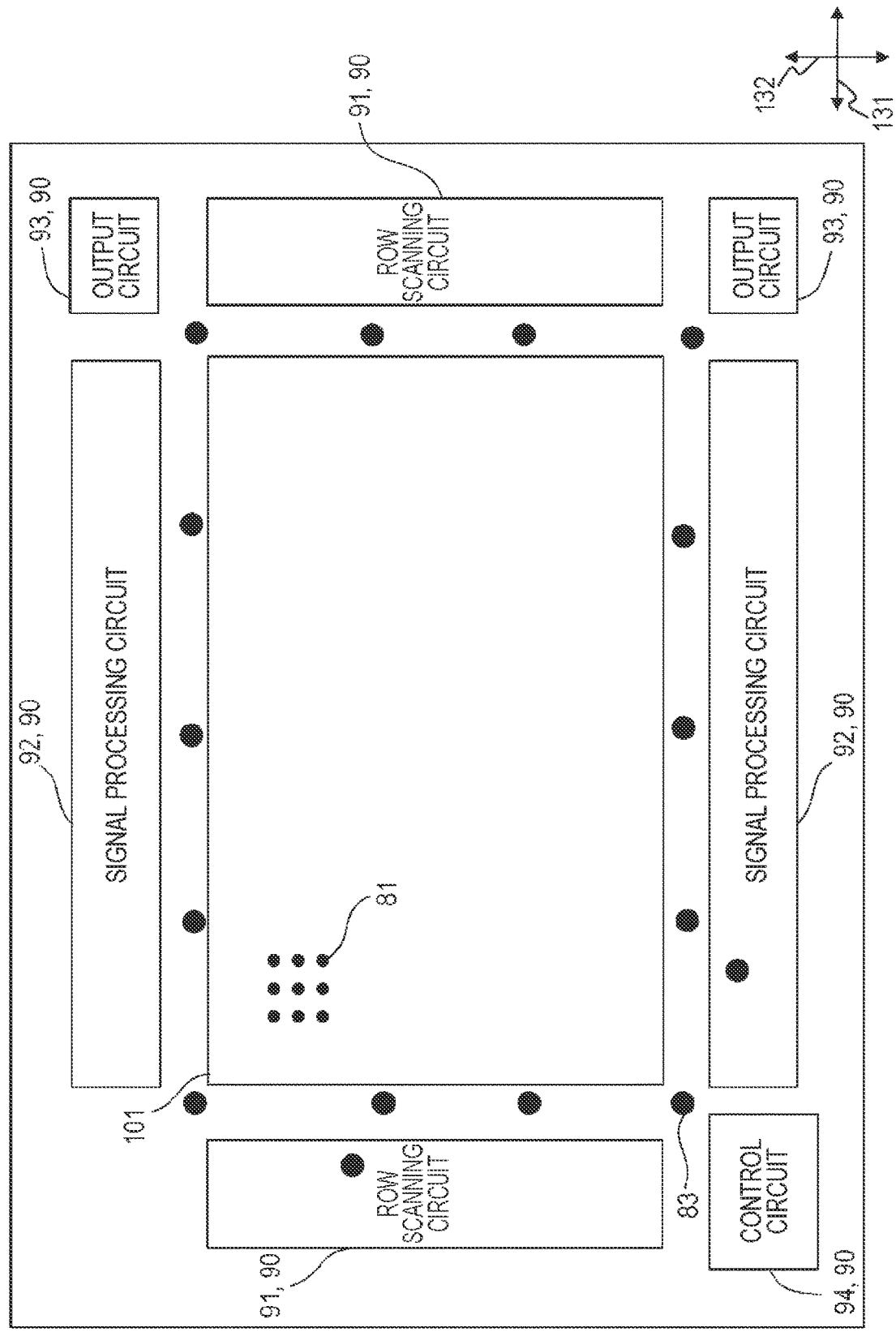
FIG. 13B illustrates a specific example of the arrangement of the penetrating electrodes.

Referring to FIG. 13A and FIG. 13B, in the peripheral region 102, the second penetrating electrode 83 are disposed not only on portions outside the peripheral circuits 90 in a plan view but also on portions within the peripheral circuits 90 in a plan view. Specifically, the second penetrating electrode 83 is disposed within the row scanning circuit 91 in the peripheral region 102 in a plan view. The second penetrating electrode 83 is disposed within the signal processing circuit 92 in the peripheral region 102 in a plan view.

The second penetrating electrodes 83 may be disposed only within the peripheral circuits 90 in the peripheral region 102 in a plan view. The second penetrating electrodes 83 may be disposed in the portions outside the peripheral circuits 90 in the peripheral region 102 in a plan view.

Figure 13C:
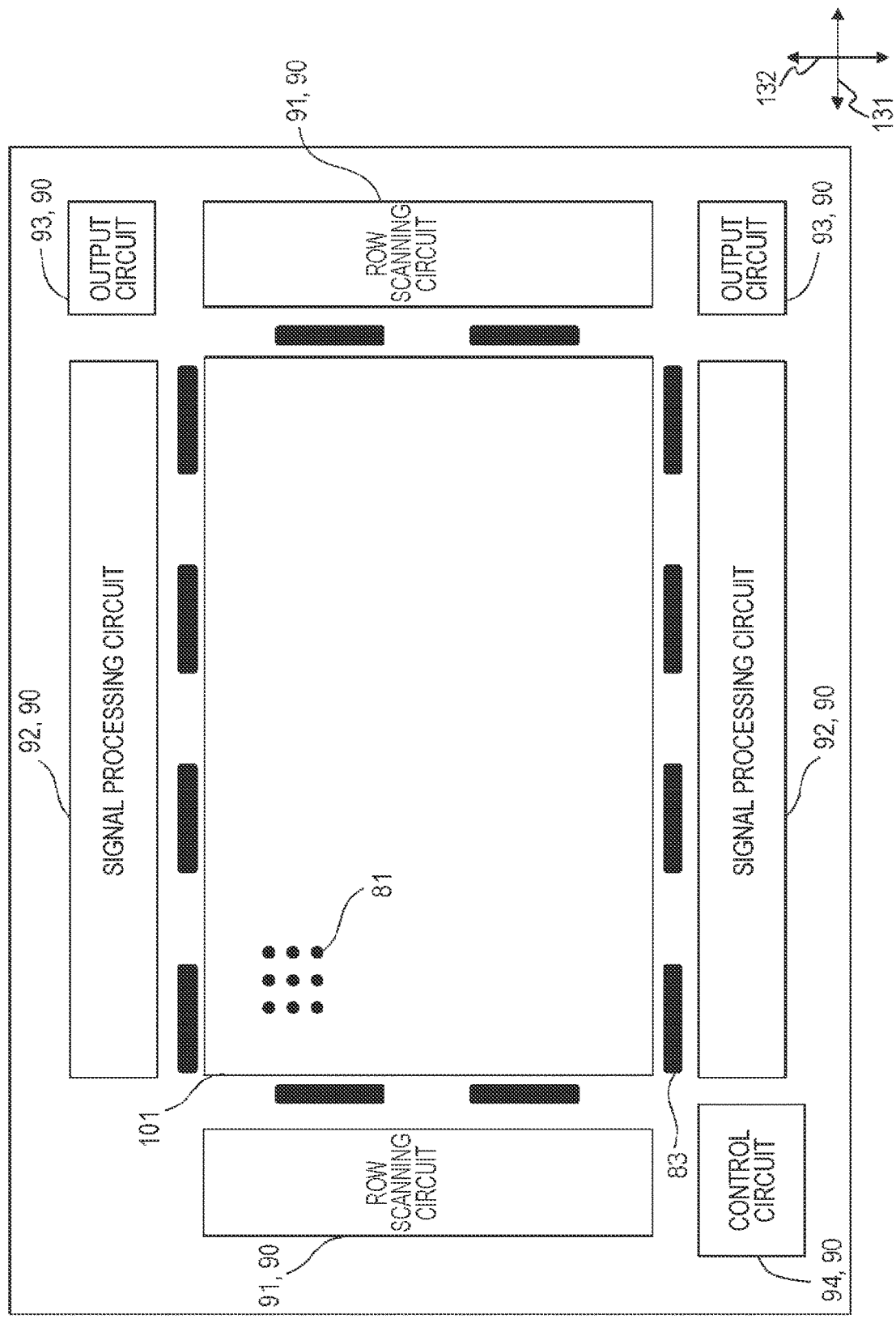
FIG. 13C illustrates a specific example of the arrangement of the penetrating electrodes.
Figure 13D:
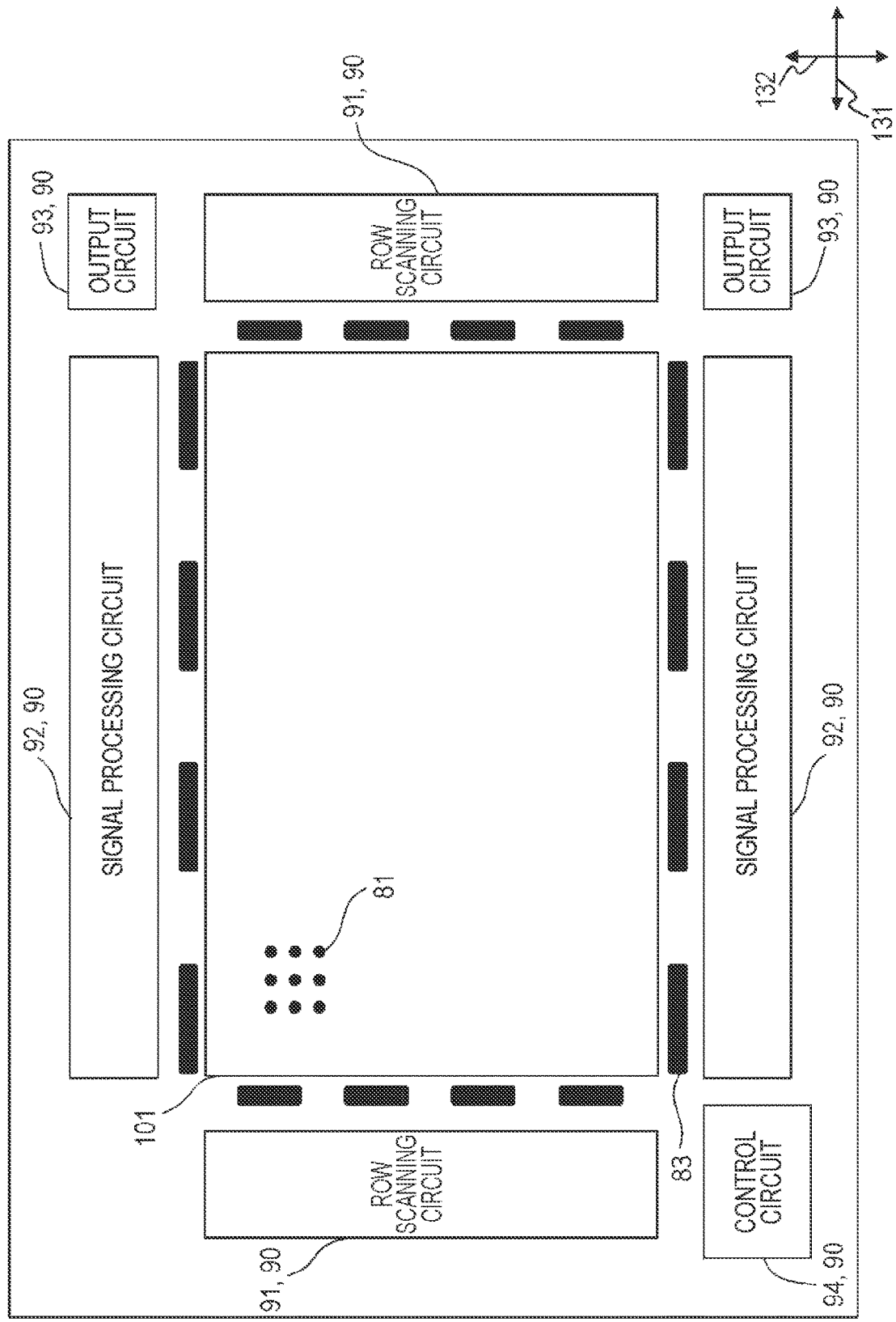
FIG. 13D illustrates a specific example of the arrangement of the penetrating electrodes.

Referring to FIG. 13C and FIG. 13D, each of the second penetrating electrodes 83 disposed in the first axis 131 has a longitudinal direction in parallel with the first axis 131 in a plan view. Each of the second penetrating electrodes 83 disposed in the second axis 132 has a longitudinal direction in parallel with the second axis 132 in a plan view.

Figure 13E:
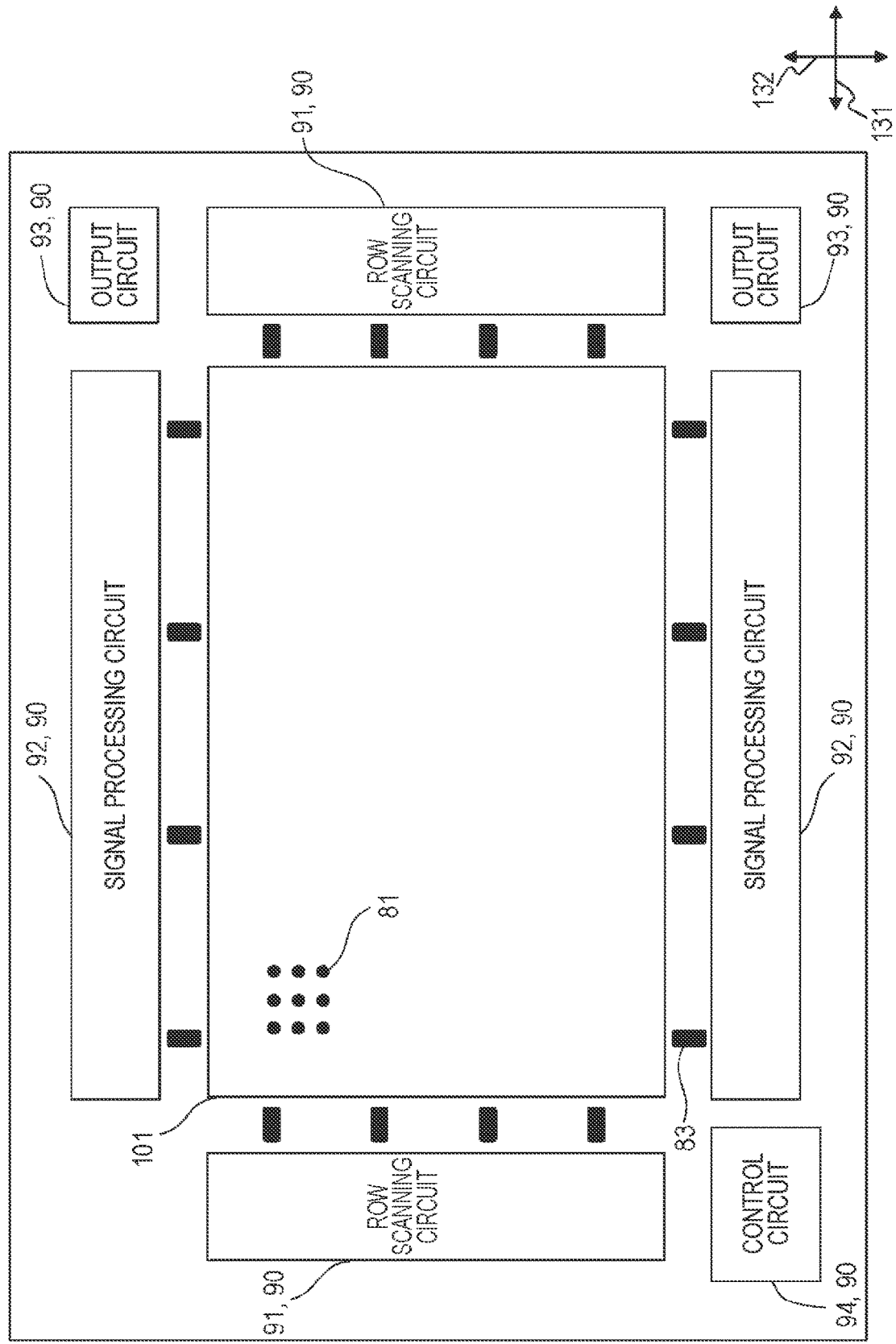
FIG. 13E illustrates a specific example of the arrangement of the penetrating electrodes.

The longitudinal direction of each of the second penetrating electrodes 83 may not necessarily match the direction of the arrangement of the second penetrating electrodes 83. Referring to FIG. 13E, each of the second penetrating electrodes 83 disposed in the first axis 131 has a longitudinal direction in parallel with an axis different from the first axis 131 in a plan view. Each of the second penetrating electrodes 83 disposed in the second axis 132 has a longitudinal direction in parallel with an axis different from the second axis 132 in a plan view. Specifically, each of the second penetrating electrodes 83 disposed in the first axis 131 has a longitudinal direction in parallel with the second axis 132 in a plan view. Each of the second penetrating electrodes 83 disposed in the second axis 132 has a longitudinal direction in parallel with the first axis 131 in a plan view.

The peripheral region 102 specifically includes wiring lines (not illustrated). Depending on the restrictions on the layout of the wiring lines, the arrangement of the second penetrating electrodes 83 may also be restricted. In practice, the locations, shapes, and sizes of the second penetrating electrodes 83 may be determined in view of the restrictions.

The embodiment has been described with reference to a back-illuminated imaging apparatus. The disclosure is also applicable to a front-illuminated imaging apparatus.

The imaging apparatus and imaging module according to the disclosure may be applied to a variety of camera systems and sensor systems, including digital still cameras, medical cameras, monitoring cameras, vehicle-mounted cameras, digital single-lens reflex cameras, and digital mirror-less cameras.

What is claimed is:

1. An imaging apparatus comprising:
   a pixel region including a first semiconductor substrate section and pixels; and
   a peripheral region including a second semiconductor substrate section and no pixels, wherein:
   the first semiconductor substrate section and the second semiconductor substrate section are mutually different portions of a single semiconductor substrate in a plan view,
   the single semiconductor substrate includes a top surface and a bottom surface opposite to the top surface,
   each of the pixels includes:
     a first electrode;
     a second electrode;
     a photoelectric conversion layer that is disposed between the first electrode and the second electrode; and
     a charge accumulation region disposed in the first semiconductor substrate section,
   the pixel region includes:
     first through-holes that penetrate the first semiconductor substrate section from the top surface to the bottom surface of the single semiconductor substrate; and
     first penetrating electrodes, each of the first penetrating electrodes being disposed in a corresponding first through-hole of the first through-holes and electrically connecting the first electrode to the charge accumulation region,
   the peripheral region includes:
     second through-holes that penetrate the second semiconductor substrate section from the top surface to the bottom surface of the single semiconductor substrate; and
     second penetrating electrodes, each of the second penetrating electrodes being disposed in a corresponding second through-hole of the second through-holes, and
   an areal density of the first penetrating electrodes that is a ratio of an area of the first penetrating electrodes to an area of the pixel region is different from an areal density of the second penetrating electrodes that is a ratio of an area of the second penetrating electrodes to an area of the peripheral region.

2. The imaging apparatus according to claim 1, further comprising an electrical path that is electrically isolated from the first penetrating electrodes and includes the second penetrating electrodes,
   wherein the electrical path does not pass through the first semiconductor substrate section and is electrically connected to a specific portion of the pixel region.

3. The imaging apparatus according to claim 2, further comprising a shield electrode electrically isolated from the first electrode, wherein
the photoelectric conversion layer is disposed between the shield electrode and the second electrode, and
the specific portion is included in the shield electrode or the second electrode.

4. The imaging apparatus according to claim 1, wherein a cross-sectional shape of each of the first penetrating electrodes and a cross-sectional shape of each of the second penetrating electrodes are neither congruent nor geometrically similar to each other.

5. The imaging apparatus according to claim 4, wherein
the cross-sectional shape of each of the first penetrating electrodes is closer to a circle than the cross-sectional shape of each of the second penetrating electrodes; and
the cross-sectional shape of each of the second penetrating electrodes is closer to a rectangle than the cross-sectional shape of each of the first penetrating electrodes.

6. The imaging apparatus according to claim 4, wherein
the peripheral region further includes a plurality of wiring lines disposed within the second semiconductor substrate section,
each of the second penetrating electrodes is located between two corresponding wiring lines of the plurality of wiring lines,
a rectangle having a minimum area surrounding the cross-sectional shape of each of the first penetrating electrodes has a first side and a second side equal to or longer in length than the first side,
a rectangle having a minimum area surrounding the cross-sectional shape of each of the second penetrating electrodes has a third side and a fourth side equal to or longer in length than the third side,
a ratio of a length of the second side to a length of the first side is defined as a first ratio,
a ratio of a length of the fourth side to a length of the third side is defined as a second ratio, and
the first ratio is lower than the second ratio.

7. The imaging apparatus according to claim 1, wherein a cross-sectional area of each of the first penetrating electrodes is different from a cross-sectional area of each of the second penetrating electrodes.

8. The imaging apparatus according to claim 7, wherein the cross-sectional area of each of the first penetrating electrodes is smaller than the cross-sectional area of each of the second penetrating electrodes.

9. An imaging apparatus comprising:
a pixel region including a first semiconductor substrate section and pixels; and
a peripheral region including a second semiconductor substrate section and no pixels, wherein:
the first semiconductor substrate section and the second semiconductor substrate section are mutually different portions of a single semiconductor substrate in a plan view,
the single semiconductor substrate includes a top surface and a bottom surface opposite to the top surface,
each of the pixels includes:
a first electrode;
a second electrode;
a photoelectric conversion layer that is disposed between the first electrode and the second electrode; and
a charge accumulation region disposed in the first semiconductor substrate section,
the pixel region includes:
first through-holes that penetrate the first semiconductor substrate section from the top surface to the bottom surface of the single semiconductor substrate; and
first penetrating electrodes, each of the first penetrating electrodes being disposed in a corresponding first through-hole of the first through-holes and electrically connecting the first electrode to the charge accumulation region,
the peripheral region includes:
second through-holes that penetrate the second semiconductor substrate section from the top surface to the bottom surface of the single semiconductor substrate; and
second penetrating electrodes, each of the second penetrating electrodes being disposed in a corresponding second through-hole of the second through-holes, and
an outline length of a cross section of each of the first penetrating electrodes is different from an outline length of a cross section of each of the second penetrating electrodes.

10. The imaging apparatus according to claim 9, wherein the outline length of the cross section of each of the first penetrating electrodes is shorter than the outline length of the cross section of each of the second penetrating electrodes.

11. The imaging apparatus according to claim 1, wherein a number density of the first penetrating electrodes in the pixel region is different from a number density of the second penetrating electrodes in the peripheral region.

12. The imaging apparatus according to claim 11, wherein the number density of the first penetrating electrodes in the pixel region is smaller than the number density of the second penetrating electrodes in the peripheral region.

13. The imaging apparatus according to claim 1, wherein the areal density of the first penetrating electrodes is smaller than the areal density of the second penetrating electrodes.

14. The imaging apparatus according to claim 1, wherein a material of the first penetrating electrodes is different from a material of the second penetrating electrodes.

15. The imaging apparatus according to claim 14, wherein
the first penetrating electrodes do not substantially contain copper, and
the second penetrating electrodes contain copper as a principal ingredient.

16. The imaging apparatus according to claim 1, wherein
the peripheral region comprises a first adjacent region that is disposed adjacent to the pixel region at a side of the pixel region perpendicular to a first direction in a plan view and a second adjacent region that is disposed adjacent to the pixel region at a side of the pixel region perpendicular to a second direction in a plan view, and
a ratio of a mean value of arrangement intervals of the second penetrating electrodes in the first adjacent region to a mean value of arrangement intervals of the second penetrating electrodes in the second adjacent region is 0.8 or higher and 1.2 or lower.

17. The imaging apparatus according to claim 1, further comprising a shield electrode electrically isolated from the first electrode, wherein
the second penetrating electrodes include at least one third penetrating electrode and at least one fourth penetrating electrode, the at least one third penetrating electrode electrically isolated from the at least one fourth penetrating electrode, the photoelectric conversion layer is disposed between the shield electrode and the second electrode, and the at least one third electrode is electrically connected to the shield electrode.

18. The imaging apparatus according to claim 17, wherein the at least one fourth penetrating electrode is electrically connected to the second electrode.

19. The imaging apparatus according to claim 17, wherein the at least one third penetrating electrode includes a plurality of third penetrating electrodes, the at least one fourth penetrating electrode includes a plurality of fourth penetrating electrodes, and a number density of the plurality of third penetrating electrodes in the peripheral region is different from a number density of the plurality of fourth penetrating electrodes in the peripheral region.

20. An imaging apparatus comprising:

a pixel region including a first semiconductor substrate section and pixels; and a peripheral region including a second semiconductor substrate section and no pixels, wherein the first semiconductor substrate section and the second semiconductor substrate section are mutually different portions of a single semiconductor substrate in a plan view, the single semiconductor substrate includes a top surface and a bottom surface opposite to the top surface, each of the pixels includes:

a first electrode;

a second electrode;

a photoelectric conversion layer that is disposed between the first electrode and the second electrode; and a charge accumulation region disposed in the first semiconductor substrate section, the pixel region includes:

first through-holes that penetrate the first semiconductor substrate section from the top surface to the bottom surface of the single semiconductor substrate; and first penetrating electrodes, each of the first penetrating electrodes being disposed in a corresponding first through-hole of the first through-holes and electrically connecting the first electrode to the charge accumulation region, the peripheral region includes:

second through-holes that penetrate the second semiconductor substrate section from the top surface to the bottom surface of the single semiconductor substrate; and second penetrating electrodes, each of the second penetrating electrodes being disposed in a corresponding second through-hole of the second through-holes, and a cross-sectional area of each of the first penetrating electrodes is smaller than a cross-sectional area of each of the second penetrating electrodes.

* * * * *